United States Patent
Mueller et al.

(10) Patent No.: US 9,008,188 B2
(45) Date of Patent: Apr. 14, 2015

(54) APPARATUS AND METHOD FOR DECODING SIGNALS

(75) Inventors: Stefan Mueller, Villingen (DE); Alexander Kravtchenko, Schwenningen (DE); Stanislaw Klinke, Tannheim (PL); Scott Matthew LoPresto, Chicago, IL (US)

(73) Assignee: Thomson Licensing, LLC, Issy-les Moullneaux (FR)

( * ) Notice: Subject to any disclaimer, the term of this patent is extended or adjusted under 35 U.S.C. 154(b) by 567 days.

(21) Appl. No.: 12/934,406

(22) PCT Filed: Mar. 27, 2009

(86) PCT No.: PCT/US2009/038542
§ 371 (c)(1),
(2), (4) Date: Sep. 24, 2010

(87) PCT Pub. No.: WO2009/120952
PCT Pub. Date: Oct. 1, 2009

(65) Prior Publication Data
US 2011/0026601 A1 Feb. 3, 2011

Related U.S. Application Data

(60) Provisional application No. 61/072,316, filed on Mar. 28, 2008.

(30) Foreign Application Priority Data

Aug. 7, 2008 (EP) .................................... 08162031

(51) Int. Cl.
*H04N 7/18* (2006.01)
*H03M 13/11* (2006.01)
(Continued)

(52) U.S. Cl.
CPC ........ *H03M 13/1171* (2013.01); *H03M 13/258* (2013.01); *H03M 13/3944* (2013.01); *H03M 13/395* (2013.01)

(58) Field of Classification Search
USPC ......................................... 375/240.01–240.29
See application file for complete search history.

(56) References Cited

U.S. PATENT DOCUMENTS 7,266,749 B1   9/2007  Zhong et al.
2007/0011570 A1 1/2007 Jeong et al.
(Continued)

FOREIGN PATENT DOCUMENTS

JP   2003258776   9/2003
JP   2007006494   1/2007
(Continued)

OTHER PUBLICATIONS

Lee, et al., "Robust Iterative Tree-Pruning Detection and LDPCC Decoding", IEEE Journal on selected areas in communication, vol. 23, No. 5, pp. 1013-1025, May 2005.

(Continued)

*Primary Examiner* — Andy Rao
(74) *Attorney, Agent, or Firm* — Robert D. Shedd; Vincent E. Duffy; Michael A. Pugel

(57) ABSTRACT

New capabilities will allow conventional broadcast transmission to be available to mobile devices. A method of decoding a bitstream is described including receiving a demodulated bitstream, the demodulated bitstream encoded using a bytecode encoding process, arranging a portion of the demodulated bitstream into a subset of bits, reordering the subset of bits, and decoding the subset of bits based on a property of the subset of bits and the encoding process. An apparatus includes means for decoding a bitstream based on a property of the subset of bits and the encoding process.

15 Claims, 20 Drawing Sheets

(51) Int. Cl.
*H03M 13/25* (2006.01)
*H03M 13/39* (2006.01)

(56) References Cited

U.S. PATENT DOCUMENTS

| | | | |
|---|---|---|---|
| 2007/0118787 A1* | 5/2007 | Schmidt | 714/752 |
| 2007/0143654 A1* | 6/2007 | Joyce et al. | 714/752 |
| 2007/0211769 A1* | 9/2007 | Lee et al. | 370/535 |
| 2007/0226585 A1 | 9/2007 | Park et al. | |
| 2007/0300135 A1 | 12/2007 | Kamiya | |
| 2009/0103636 A1* | 4/2009 | Stewart | 375/240.27 |
| 2009/0287981 A1* | 11/2009 | Kimura et al. | 714/752 |
| 2010/0299699 A1* | 11/2010 | Citta et al. | 725/32 |

FOREIGN PATENT DOCUMENTS

| | | |
|---|---|---|
| JP | 2007228588 | 9/2007 |
| JP | 2010527560 | 11/2008 |
| WO | WO2008144003 | 11/2008 |

OTHER PUBLICATIONS

Evans, et al., "Grammer Based Compression", ACM, vol. 46, No. 8, pp. 61-66, 2003.

Search Report dtd Dec. 16, 2009.

Rong Zhou et al: "Reliable transmission with low complexity Reed-Solomon block turbo codes", Wireless Communication Systems, 2004, 1st International Symposium on.

Sheng, "On Short Forward Error-Correcting Codes for Wireless Communication Systems," Faculty of Engineering and Information Sciences Papers, Jan. 1, 2007.

Sheng, "On the Performance of Short Forward Error-Correcting Codes," IEEE Communications Letters, Nov. 2007, vol. 11, No. 11, pp. 880-882.

Young, "A Recursive Trellis Decoder to Approach the Shannon Capacity in ATSC DTV Receivers," Consumer Electronics, 2008. ICCE 2008, Digest of Technical Papers, Jan. 13, 2008.

ATSC, "ATSC Digital Television Standard Part2 RF/Transmission System Characteristics," ADTSC, Mar. 1, 2007.

Nobuo Itoh, et al., A DC Component Supression Method with a Faculty of Error Corrections, ITEJ Technical Report, Dec. 8, 1995, vol. 19, No. 71, pp. 59-66, VIR95-100.

Masato Kitakami, et al. Pararllel Decoding Method for Byte Error Correcting Codes, 1995, IEICE Collection of papers in the lectures of the Fundamental Conference, Aug. 15, 1995.

Hidehiro Matsuoka, et al., Performance Analysis of Adaptive Moduclation Systems with Concatenated Code for Ditigal Land Mobile Commun, IEICE Technical Report, Feb. 26, 1996.

* cited by examiner

APPARATUS AND METHOD FOR DECODING SIGNALS

CROSS REFERENCE TO RELATED APPLICATIONS

This application claims the benefit under 35 U.S.C. §365 of International Application PCT/US2009/038542, filed Mar. 27, 2009, which was published in accordance with PCT article 21(2) on Oct. 1, 2009 and claims the benefit under 35 U.S.C. §119 of provisional application 61/072,316 filed in the United States on Mar. 28, 2008 and the benefit under 35 U.S.C. §119 of foreign application EP08162031 filed in the European Patent Office on Aug. 7, 2008.

FIELD OF THE INVENTION

The present disclosure relates generally to the operation of a digital signal data transmission system and more specifically to the decoding of data for broadcast television that is intended for use by mobile, pedestrian, and personal devices.

BACKGROUND OF THE INVENTION

This section is intended to introduce the reader to various aspects of art, which may be related to various aspects of the present invention that are described below. This discussion is believed to be helpful in providing the reader with background information to facilitate a better understanding of the various aspects of the present invention. Accordingly, it should be understood that these statements are to be read in this light, and not as admissions of prior art.

Television broadcast systems throughout the world have migrated from the delivery of analog audio and video signals to modern digital communications systems. For example, in the United States, the Advanced Television Standards Committee (ATSC) has developed a standard called "ATSC Standard: Digital Television Standard A/53" (the A53 standard). The A53 standard defines how data for digital television broadcasts should be encoded and decoded. In addition, the U.S. Federal Communications Commission (FCC) has allocated portions of the electromagnetic spectrum for television broadcasts. The FCC assigns a contiguous 6 MHz channel within the allocated portion to a broadcaster for transmission of terrestrial (i.e., not cable or satellite) digital television broadcasts. Each 6 MHz channel has a channel capacity of approximately 19 Mb/second based on the encoding and modulation format in the A53 standard. Furthermore, the FCC has mandated that transmissions of terrestrial digital television data through the 6 MHz channel must comply with the A53 standard.

Digital broadcast signal transmission standards, such as the A53 standard, define how source data (e.g., digital audio and video data) should be processed and modulated into a signal that is transmitted through the channel. The processing adds redundant information to the source data so that a receiver that receives the signal from the channel may recover the source data, even if the channel adds noise and multi-path interference to the transmitted signal. The redundant information added to the source data reduces the effective data rate at which the source data is transmitted but increases the potential for successful recovery of the source data from the transmitted signal.

The A53 standard development process was focused on high definition television (HDTV) and fixed reception. The system was designed to maximize video bit rate for the large high resolution television screens that were already beginning to enter the market. Transmissions broadcast under the ATSC A/53 standard, or legacy encoding and transmission standard, present difficulties for mobile receivers.

Recognizing this fact, in 2007, the ATSC announced the launch of a process to develop a standard that would enable broadcasters to deliver television content and data to mobile and handheld devices via their digital broadcast signal. Changes to the legacy transmission standard include an additional encoding scheme to introduce further data redundancy. The additional encoding has been adapted to better perform with advanced receivers in mobile, handheld and pedestrian devices while still remaining backward compatible with the legacy A53 standard. The proposed changes also allow operation of existing ATSC services in the same radio frequency (RF) channel without an adverse impact on existing receiving equipment.

However, any new encoding scheme introduced into the present A53 standard broadcast signal also introduces additional complexity into the decoding process of an ATSC M/H receiver. For instance, the addition of concatenated block coding, in addition to the trellis decoding and Reed-Solomon decoding already present for legacy operation, may significantly increase the processing time in a receiver based on known serialized input bit processing associated with iterative a-posteriori type decoders often used for block decoding. Decoding performance is often directly related to the number of iterations necessary to achieve the optimal or desired decoded output. The number of iterations, or efficiency, in the decoder will be limited by a combination of the decoder architecture and the speed that the decoder architecture can process the incoming message signal. Further, the use of large look-up tables, used to reduce decoder processing time, create inefficiencies with respect to the physical size of the decoder architecture. It is therefore desirable to improve the decoding process and decoder efficiency by developing an improved decoding architecture.

SUMMARY OF THE INVENTION

In accordance with an aspect of the present embodiments, a method of decoding a bitstream is described including receiving a demodulated bitstream, the demodulated bitstream encoded using a byte-code encoding process, arranging a portion of the demodulated bitstream into a subset of bits, reordering the subset of bits, and decoding the subset of bits based on a property of the reordered subset of bits and the byte-code encoding process.

In accordance with another aspect of the present embodiments, a method of decoding a bitstream is described including receiving a demodulated bitstream, arranging a portion of the demodulated bitstream into a subset of bits, identifying a symbol in the subset of bits, and decoding a current state of the symbol based on a previous decoded state of the symbol and a set of relationships between at least two bits in the subset of bits.

In accordance with another aspect of the present embodiments, an apparatus is described including means for receiving a demodulated bitstream, the demodulated bitstream encoded using a byte-code encoding process means for grouping a portion of the demodulated bitstream into a subset of bits, means for reordering the subset of bits, and means for decoding the subset of bits based on a property of the reordered subset of bit and the byte-code encoding process.

In accordance with another aspect of the present embodiments, an apparatus is described including means for receiving a demodulated bitstream, means for arranging a portion of the demodulated bitstream into a subset of bits, means for identifying a symbol in the subset of bits, and means for decoding a current state of the symbol based on a previous decoded state of the symbol and a relationship between at least two bits in the subset of bits.

Figure 1:
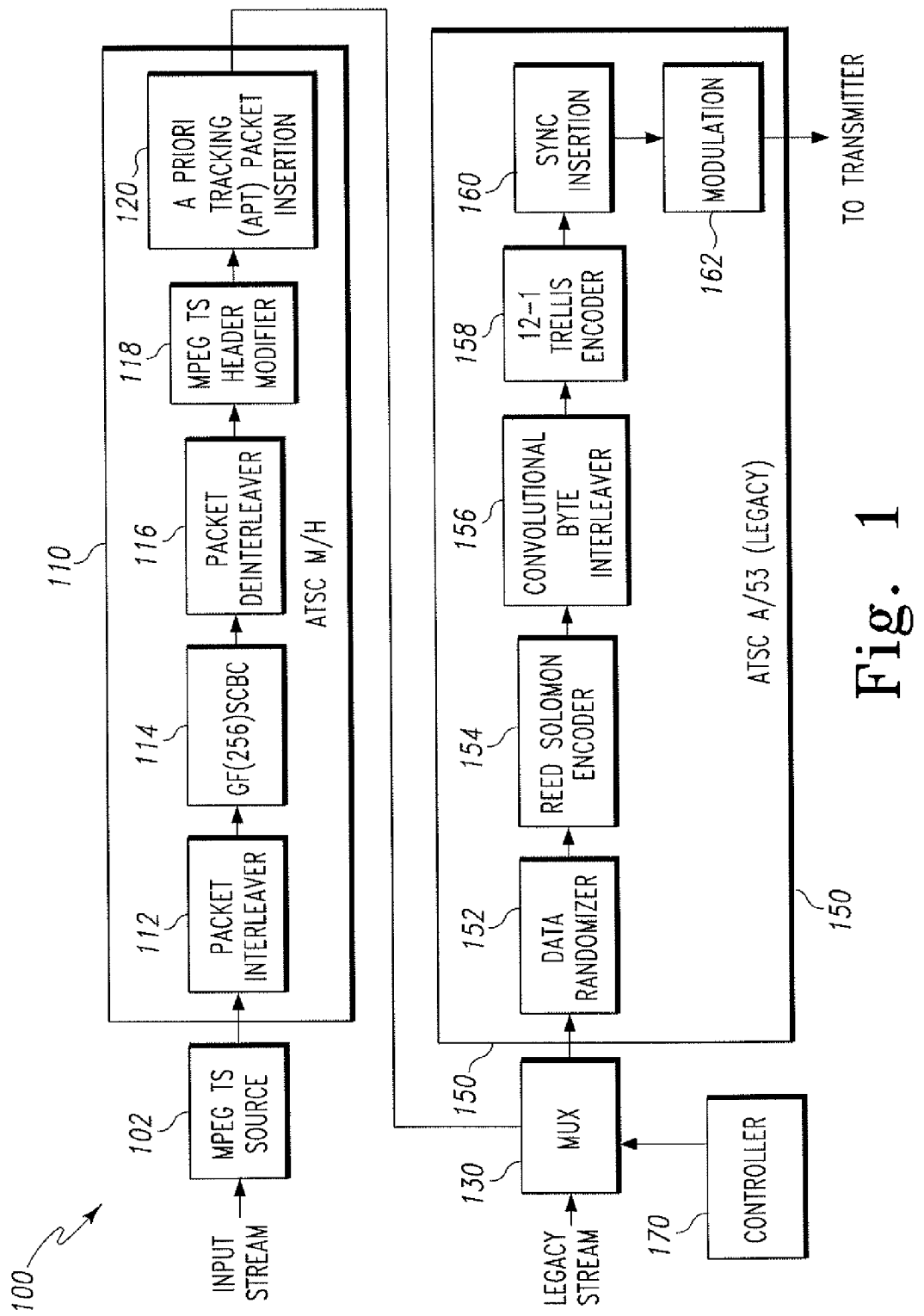
FIG. 1 is a block diagram of an embodiment of an encoder of the present disclosure.

The characteristics and advantages of the present disclosure may become more apparent from the following description, given by way of example.

DETAILED DESCRIPTION

One or more specific embodiments of the present disclosure will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort would nevertheless be a routine undertaking of design, fabrication, and manufacture for those of ordinary skill having the benefit of this disclosure.

The following describes a system relating to television broadcast signals, and more particularly to broadcast signals as defined for use in the United States. The embodiments described may be used in mobile, handheld, or pedestrian receiving devices. Examples of the devices used include, but are not limited to, cellular phones, intelligent phones, personal digital assistants, laptop computers, and portable televisions. Other systems utilized to transmit and receive other types of signals may include similar structures and processes. Those of ordinary skill in the art will appreciate that the embodiments of the circuits and processes described herein are merely one set of potential embodiments. It is important to note that signals compliant with broadcast and wireless standards, such as the A53 standard, in general, may be transmitted in a manner other than over the air, including transmission over satellite link, co-axial cable, or telephone lines. As such, in alternate embodiments, the components of the system may be rearranged or omitted, or additional components may be added. For example, with minor modifications, the system described may be configured for use in other terrestrial broadcast services, satellite video and audio services, or phone data services, including services used elsewhere in the world.

The embodiments described below are primarily related to transmission and reception of signals. Certain aspects of the embodiments including, but not limited to, certain control signals and power supply connections have not been described or shown in the figures but may easily be ascertained by a skilled artisan. It should be noted that the embodiments may be implemented using hardware, software, or any combination of both, including the use of a microprocessor and program code or custom integrated circuits. It should also be noted that many of the embodiments involve iterative operation and connection between the various elements of the embodiment. Alternative embodiments may be possible using pipelining architectures employing repeated identical elements, connected in series, in place of, or in addition to, the iteration operation embodiments described herein.

Turning now to FIG. 1, a block diagram of an embodiment of an encoder 100 is shown. Encoder 100 is particularly suited for encoding and transmitting a rugged or robust data stream in conjunction with the A53 transmission standard. Encoder 100 includes an MPEG transport stream source 102. The MPEG transport stream source 102 is connected to an ATSC M/H block 110 that contains several additional blocks. The blocks contained within the ATSC M/H block 110 process an incoming data stream and produce a rugged data stream adapted for reception and use by mobile, pedestrian, and handheld devices. These blocks will be further described below. The ATSC M/H block 110 is connected to a mux 130. The mux 130 also receives transport data content for use with legacy ATSC A53 only encoding. The mux 130 connects to an ATSC A53 legacy block 150 that also contains several additional blocks within it. The blocks within ATSC A53 legacy block 150 may represent blocks used for encoding and transmitting the existing broadcast signal in an A53 signal format. These blocks will also be further described below. A controller 170 is connected to mux 130 and MPEG transport stream source 102. Controller 170 may also connect to other blocks in encoder 100.

Within ATSC M/H block 110, a packet interleaver 112 receives a stream of data arranged in packets. Each packet contains 187 bytes and includes a 3 byte header used for packet identification. The output of the packet interleaver 112 is provided to a Galois Field GF(256) Serial Concatenated Block Coder (SCBC) 114. The output of the GF(256) SCBC 114 is connected to a packet deinterleaver 116. The output of the packet deinterleaver 116 is connected to a transport stream header modifier 118. The output of the transport stream header modifier 118 is connected to an a-priori transport packet inserter 120. The output of the a-priori transport packet inserter 120 is connected to the mux 130.

The packet interleaver 112 rearranges the data received as packets, typically arranged in rows, into codewords based on columns of bytes from the rows of packets. Packet interleaver 112 takes the bytes from a fixed number of consecutive packets in a row-by-row order and outputs the bytes column by column. In one embodiment, packet interleaver 112 reads in 12 rows of 187-byte packets and outputs 187 columns of 12-byte codewords. As a result of the packet interleaving, all of the first bytes are grouped together; all of the second bytes are grouped together; and so forth. The number of packets read into packet interleaver 112 constitute a source frame and equals the number of source codewords or symbols required for processing in GF(256) SCBC 114. It is important to note that the dimension of packet interleaver 112 may change based on the type and size of memory included.

The GF(256) SCBC 114 is an embodiment of a byte-code encoder. In particular, the GF(256) SCBC 114 is implemented using short linear block codes over the Galois Field (256) space. Several possible constituent block codes may be used. For example, a rate 1/2 byte-code encoder may use the following generator matrix:

$$G = (1\ 2) \quad (1)$$

A rate 2/3 byte-code encoder may use the following generator matrix:

$$G = \begin{pmatrix} 1 & 0 & 2 \\ 0 & 1 & 2 \end{pmatrix} \quad (2)$$

The generator matrix is formed using an identity matrix and a column of b elements, shown as the values in the last column in equations 1 and 2 above. Other code rates may also be used.

It is important to note that the coefficients in the generator matrix for each constituent code have been optimized based on the relationship of the block code encoding to the entire error correction system and modulation process. Other coefficients may be used. The optimization has especially taken into account the trellis coding and bit to symbol mapping in the ATSC 8-VSB modulation because these aspects are the first aspects encountered in the receiving and demodulation process.

The GF(256) SCBC 114 may be either a simple or concatenated block code encoder. A concatenated block code encoder may include other functions such as interleaving and puncturing. An embodiment of a concatenated block code encoder will be described in further detail below. The GF(256) SCBC 114 may also be capable of encoding multiple encoding rates and may further be capable of switching rate modes through a rate mode controller, not shown. In a preferred embodiment, the GF(256) SCBC 114 may be adapted to encode the incoming stream of data using one of a rate 1/2 constituent code, a rate 12/26 concatenated code, or a rate 24/208 concatenated code.

The GF(256) SCBC 114 encodes the bytes along the columns outputted from interleaver 112. In other words, the GF(256) SCBC 114 encodes following the second dimension of an interleaver matrix formed through the processing in packet interleaver 112.

The packet deinterleaver 116 receives the encoded stream of codewords produced by the GF(256) SCBC 114 and outputs reconstituted rows of 187-byte packets. Packet deinterleaver 116 inputs the encoded codewords in column by column order, with each column including both the original message or systematic bytes and the redundant or non-systematic bytes that were added by the processing in the GF(256) SCBC 114, and outputs the bytes in a row by row arrangement. The process is essentially a reverse of the process described for packet interleaver 112. The packet deinterleaver 112 inputs the same number of columns of codewords, with each codeword now including an encoded set of non-systematic bytes. The number of rows at the output corresponds to the encoded codeword length. For instance, in a 12/26 code rate, 26 rows of packets will be outputted.

The MPEG transport stream header modifier 118 receives the deinterleaved 187-byte packets containing groups of systematic and non-systematic packets and modifies the 3 byte identifier header included in each packet. The 3 bytes include a program identifier (PID), along with several other bits or groups of bits used to convey information regarding the packet. It is important to note that in order to maintain the most efficient operation of receivers capable of receiving the legacy or A53 broadcast signal, but not capable of correctly decoding and/or recognizing the ATSC M/H encoded packets (e.g. legacy receivers), certain bits in the headers of a portion of the ATSC M/H packets may be modified.

The a-priori tracking packet inserter 120 may place predetermined tracking packets into the rugged data stream. The predetermined packets represent packets of information that are completely or mostly known to a receiver capable of receiving the rugged data stream, such as the receiver used in a mobile, pedestrian, or handheld device. The predetermined packets are used in the receiver to assist in decoding the trellis state created during the legacy or existing A53 encoding portion of the signal encoding and transmission. The predetermined packets may also assist with convergence in the equalizer portion of the receiver. It is important to note that the predetermined packets are not intended to improve reception in a legacy receiver, but may still result in a potential improvement. The predetermined tracking packets may be generated in a number of ways using known training sequence processes, including a pseudo random number generator sequence known to the receiver.

The rugged or robust data stream generated in the ATSC M/H block 110 is provided to a mux 130. Mux 130 also receives a legacy data stream from a data source not shown. Note that in some embodiments, the legacy data stream may be provided from MPEG transport stream source 102. Mux 130 may include a buffer memory in order to store portions of the incoming robust ATSC M/H data stream and the legacy data stream. The mux 130 generates the time multiplexing of the rugged ATSC M/H data stream and the legacy data stream together and provides the multiplexed stream to the ATSC A53 legacy block 150.

Mux 130 is controlled by controller 170. Controller 170 may be a separate circuit that is embodied as a microprocessor or microcontroller. Controller 170 may alternatively be included in one of the other blocks such as the MPEG transport stream source 102. Controller 170 may also be incorporated into another controller used for the operation of the entire modulation and transmission apparatus.

The legacy ATSC encoder 150 identically encodes the rugged and packets and legacy packets, provided as a multiplexed data stream, in compliance with the legacy A53 standard. A data randomizer 152 randomizes the packet and provides the packet to the Reed-Solomon encoder 154. Randomization of the data is typically performed by multiplying the packets of data by a random number sequence that is also known to the receiver. The Reed-Solomon encoder 154 calculates and concatenates 20 parity bytes to the randomized data to produce a R-S packet that has 207 bytes.

A convolutional interleaver 156 interleaves the R-S packet in order to further randomize the data in time. A trellis encoder 158 encodes the interleaved packet to produce a block of 828 3-bit symbols. The A53 standard specifies the use of 12 trellis encoders, wherein each trellis encoder is a 2/3-rate trellis encoder producing a 3 bit symbol for every two bits present in the interleaved packet. As a result, the trellis encoder 158 includes a de-multiplexer, twelve parallel 2/3-rate trellis encoders, and a multiplexer. Data from the convolutional interleaver 156 is de-multiplexed and distributed to the twelve trellis encoders and the symbols generated by the twelve trellis encoders are multiplexed into stream of symbols.

A sync inserter 160 inserts 4 predefined segment sync symbols at the beginning of each 828-symbol block to create an 832-symbol segment. In addition, the sync inserter 160 inserts a field sync comprising 832 symbols for every 312 segments that are generated. In particular, the field sync symbols precede the 312 segments.

An 8-VSB modulator 162 uses the multiplexed symbols, including the data encoded by the trellis encoder 158, the segment sync symbols, and the field sync to modulate a carrier signal using 8-VSB (vestigial sideband) modulation. Specifically, the 8-VSB modulator 162 generates a pulse amplitude modulated (PAM) signal. The amplitude of the PAM signal will be at one of 8 discrete levels, where each discrete level corresponds to a particular 3 bit symbol. The PAM signal is converted from digital to analog signal format, filtered in order to produce the correct signal pulse shape, and up-converted to radio frequency, using circuitry not shown.

The data generated by a transmission source such as MPEG transport stream source 102 or the source for the legacy content includes video that is source encoded using the motion picture entertainment group (MPEG) 2 format that is also equivalent to International Standards Organization/International Electrotechnical Commission (ISO/IEC) 13818-2 format. The data also includes audio data that is source encoded using Dolby Arc Consistency algorithm #3 (AC-3). The A53 standard also allows the use of metadata for other program elements such as program guide data and such program elements may be source encoded using other methods. In addition, The A53 standard allows transmission of video at a variety of video quality levels and display formats including, but not limited to, standard definition interlaced television quality and progressive scan widescreen high definition television quality.

Figure 2:
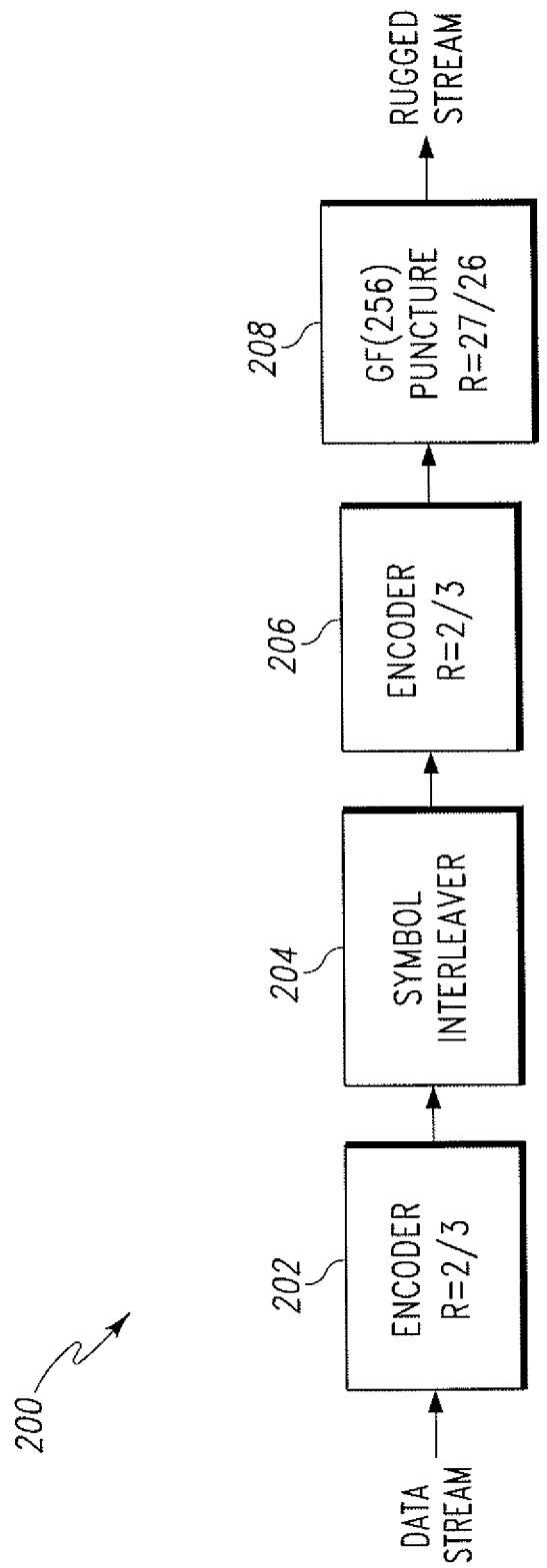
FIG. 2 is a block diagram of an embodiment of a concatenated byte-code encoding circuit of the present disclosure.

Turning now to FIG. 2, a block diagram of an embodiment of a concatenated byte-code encoder 200 is shown. The concatenated byte-code encoder 200 may be used in place of the GF(256) SCBC encoder 114 described in FIG. 1 and allows encoding of codewords in the data stream using a 12/26 code rate. The concatenated byte-code encoder 200 receives packets or codewords and provides them to a first 2/3 rate byte-encoder 202. The output of the first 2/3 rate byte-code encoder 202 is provided to an interleaver 204. The output of the interleaver 204 is provided to a second 2/3 rate byte-code encoder 206. The output of the second 2/3 rate byte-code encoder 206 is provided to a byte puncture block 208. The output of the puncture block 208 is provided to a data packetizer 210. The output of the data packetizer 210 may be provided for further processing (e.g. legacy transmission encoding as previously described in FIG. 1.)

The first 2/3-rate byte-code encoder 202 receives 12 bytes of the content data packets and generates a first byte-code encoded stream from the 12 bytes. For every two content data bytes $M_A$ and $M_B$ of the 12 bytes, the first byte-code encoded stream included duplicates of the bytes $M_A$ and $M_B$ and a redundant byte $M_{AB}$ that is calculated using the generator matrix in equation 2. In some embodiments, the content data bytes $M_A$ and $M_B$ are bytes of one content data packet generated by a data generator (e.g. data generator 102 in FIG. 1.) In other embodiments, the first 2/3-rate byte-code encoder 202 selects the content data bytes $M_A$ and $M_B$ from two different content data packets A and B, respectively. For every 12 bytes of content data, 18 bytes are output as part of the first byte-code encoded output stream.

The byte-code encoded stream from the first byte-code encoder 202 is interleaved by interleaver 204 to produce an interleaved stream containing 18 interleaved bytes. The interleaver 204, as well as other interleavers described below, may use any of the interleaving methods known in the art (e.g., pseudo-random, row-column, code-optimized, etc.). In addition, interleavers may also include a memory with a storage capacity to store the entire interleaver data length.

The interleaved stream is provided to a second 2/3-rate byte-code encoder 206. The second 2/3 rate byte-code encoder 206 encodes the groups of 18 interleaved bytes in the interleaved stream to generate a second byte-code encoded stream that includes groups of 27 bytes. As described above, for every two bytes $M_A$ and $M_B$ produced by the interleaver, the second 2/3-rate byte-coded stream has duplicates of the two bytes $M_A$ and $M_B$ and a generated redundant byte $M_{AB}$. It should be apparent that byte $M_A$ may be a duplicate of one of the bytes of content data generated by a data generator (e.g. data generator 102 in FIG. 1.) or may be a byte developed as a redundant or non-systematic byte by the first byte-code encoder 202. Similarly, the byte $M_B$ may be a duplicate of a byte of the content data or a byte developed as a redundant or non-systematic by first byte-code encoder 202.

A byte puncture block 208 removes one byte from the group of 27 bytes in the second byte-code encoded stream to produce a punctured stream containing groups 26 bytes. Byte puncturing is used to improve data efficiency by reducing the number of bytes provided and transmitted for a given coding structure. However, the improved data efficiency is traded off against the resulting degradation in performance in the decoding circuitry in a receiver due to the absence of one or more encoded bytes from the data stream. Byte puncturing may also be used to produce a grouping or block of bytes or packets of encoded data that is convenient for the transmission format. Coding structures based on certain groupings of bytes or packets are often referred to as block codes.

Packetizer 210 combines and groups bytes from the punctured stream into discrete packets of 187 bytes. The rugged data stream produced by the components of the byte-code encoder 200 produces a 12/26-rate data stream. The byte code encoder 200 may also produce a 12/27-rate data stream if the byte puncture block 208 is not used.

Concatenated byte-code encoders similar to concatenated byte-code encoder 600 may be employed to produce rugged data streams other than the 12/27-rate and 12/26-rate rugged data streams described above. For instance, data streams with code rates such as 17/26 and 12/52 rate may be produced through combinations of constituent byte-code encoders, interleavers, and puncture blocks. Similarly, other types or arrangements of interleavers or puncture blocks may be substituted for those used in the described embodiments.

Figure 3:
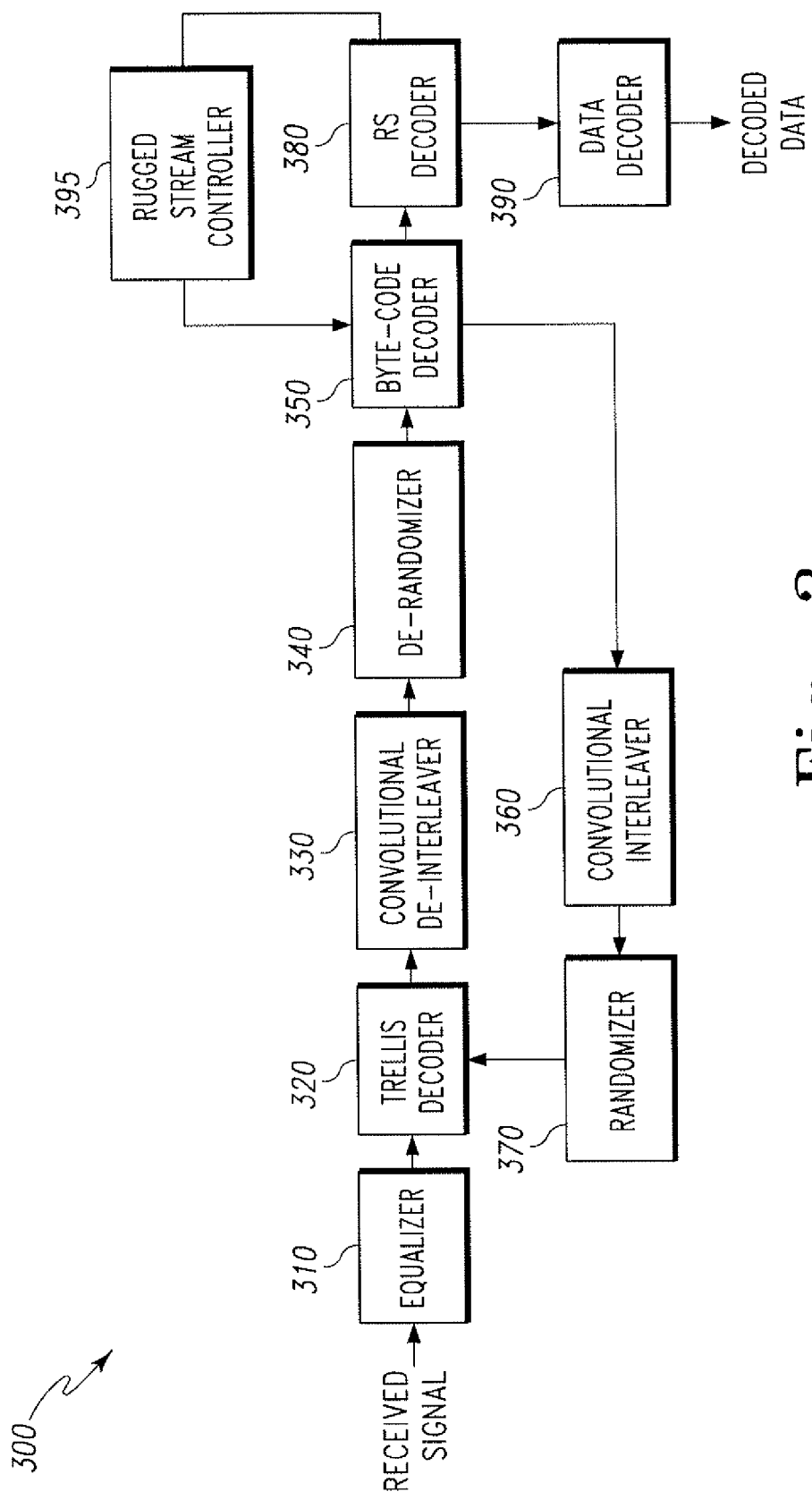
FIG. 3 is a block diagram of an embodiment of a decoder used in a receiver of the present disclosure.

Turning now to FIG. 3, a block diagram of an embodiment of a decoder 300 used in a receiver is shown. Decoder 300 includes circuitry and processing for receiving and decoding signals that have been adversely affected by transmission of the signal over a transmission medium such as electromagnetic waves over the air. Decoder 300 is capable of decoding both a rugged data stream as well as a legacy data stream. For example, decoder 300 may be included in a receiver capable of receiving and decoding a signal transmitted as an ATSC M/H signal.

In decoder 300, the incoming signal, following initial processing, is provided to equalizer 310. Equalizer 310 is connected to trellis decoder 320, which provides two outputs. A first output from trellis decoder 320 provides feedback and is connected back as a feedback input to equalizer 310. The second output from trellis decoder 320 is connected to a convolutional de-interleaver 330. The convolutional de-interleaver 330 is connected to a de-randomizer 340. The output of the de-randomizer 340 is connected to a byte-code decoder 350, which also provides two outputs. A first output from byte-code decoder 350 is connected back as a feedback input to trellis decoder 320 through a convolutional interleaver 360 and a randomizer 370. The second output from byte-code decoder 350 is connected to a Reed-Solomon decoder 380. The output of the Reed-Solomon decoder 380 is connected to a data decoder 390. A rugged stream controller 395 is connected to the byte-code decoder 350 and Reed-Solomon decoder 380. It is important to note that the equalizer 310, trellis decoder 320, convolutional de-interleaver, de-randomizer 340, Reed-Solomon decoder 380, and data decoder 390 are connected, and functionally operate, in a manner similar to those blocks in a conventional receiver used for receiving ATSC A53 legacy broadcast signals.

An input signal from the front end processing (e.g. antenna, tuner, demodulator, A/D converter) of the receiver (not shown) is provided to equalizer 310. Equalizer 310 processes the received signal to completely or partially remove the transmission channel effect in an attempt to recover the received signal. The various removal or equalization methods are well known to those skilled in the art and will not be discussed here. Equalizer 310 may include multiple sections of processing circuitry including a feed-forward equalizer (FFE) section and a decision-feedback-equalizer (DFE) section. Equalizer 310 may also include circuits for sync removal and timing and a-priori training packet processing.

The equalized signal is provided to trellis decoder 320. The trellis decoder 320 produces, as one output, a set of decision values that are provided to the DFE section of equalizer 310. The trellis decoder 320 may also generate intermediate decision values that are also provided to the DFE section of equalizer 310. The DFE section uses the decision values along with intermediate decision values from the trellis decoder 320 to adjust values of filter taps in equalizer 310. The adjusted filter tap values cancel interference and signal reflections that are present in the received signal. The iterative process allows equalizer 310, with the assistance of feedback from trellis decoder 320, to dynamically adjust to a potential changing signal transmission environment conditions over time. It is important to note that the iterative process may occur at a rate similar to incoming data rate of the signal, such as 19 Mb/s for a digital television broadcast signal. The iterative process also may occur at a rate higher than the incoming data rate.

The trellis decoder 320 also provides a trellis decoded data stream to convolutional de-interleaver 330. Convolutional de-interleaver 330 generates de-interleaved bytes organized within data packets in a manner reversing the interleaving performed in an encoder, such as by convolutional byte interleaver 156. The de-interleaved packets are de-randomized by de-randomizer 340. De-randomizer 340 removes the randomizing content that was added at the encoder by multiplying the packets by the complement of the complex number sequence used by the randomizer in the encoder, such as data randomizer 152. The de-randomized packets are provided to the byte-code decoder 350. Byte-code encoder 350 typically only processes the packets from a rugged or robust data stream. As a result, packets that are not a part of a rugged data stream are simply passed through the byte-code decoder 350 to the Reed-Solomon decoder 380. It is important to note that the trellis decoded stream provided to the remaining blocks in byte-code decoder 300 may be in the form of probabilities or reliabilities for the information contained in the data stream.

Byte-code decoder 350 and the trellis decoder 320 operate in an iterative manner, referred to as a turbo-decoder, to decode the rugged data stream. Specifically, the trellis decoder 320 provides, after de-interleaving and de-randomizing, a first soft decision vector to the byte-code decoder 350 for each byte of the packets that are included in the rugged data stream. Typically, the trellis decoder 320 produces the soft decision as a vector of probability values. In some embodiments, each probability value in the vector is associated with a value that the byte associated with the vector may have. In other embodiments, the vector of probability values is generated for every half-nibble (i.e., two bits) that is contained in the systematic packet because the 2/3-rate trellis decoder estimates two-bit symbols. In some embodiments the trellis decoder 320 combines four soft decisions associated with four half-nibbles of a byte to produce one soft-decision that is a vector of the probabilities of values that the byte may have. In such embodiments, the soft-decisions corresponding to the byte are provided to the byte-code decoder 350. In other embodiments, the byte-code decoder separates a soft-decision regarding a byte of the systematic packet into four soft-decision vectors, wherein each of the four soft-decisions is associated with a half-nibble of the byte.

The byte-code decoder 350 uses the soft decision vector associated with the bytes, comprising packets of the rugged data stream, to produce a first estimate of the bytes that comprise the packets. The byte-code decoder 350 uses both the systematic and the non-systematic packets to generate a second soft decision vector for each byte of packets comprising the rugged stream, and provides the second soft-decision vector to the trellis decoder 320, after re-interleaving by convolutional interleaver 360 and re-randomizing by randomizer 370. It is important to note that the convolutional interleaver 360 and randomizer 370 functionally operate in a manner similar to convolutional byte interleaver 156 and data randomizer 152 described in FIG. 1. The trellis decoder 320 thereafter uses the second soft-decision vector to produce a further iteration of the first decision vector, which is provided to the byte-code decoder 350. The trellis decoder 320 and the byte-code decoder 350 iterate in this fashion until the soft-decision vector produced by the trellis decoder and byte-code decoder converge or a predetermined number of iterations are undertaken. Thereafter, the byte-code decoder 350 uses the probability values in the soft-decision vector for each byte of the systematic packets to generate a hard decision for each byte of the systematic packets. The trellis decoder 320 may be implemented using a Maximum a Posteriori (MAP) decoder and may operate on either byte or half-nibble (symbol) soft decisions.

It is important to note that turbo-decoding typically utilizes iteration rates related to passing decision data between blocks that are higher than the incoming data rates. The number of possible iterations is limited to the ratio of the data rate and the iteration rate. As a result and to the extent practical, a higher iteration rate in the turbo-decoder generally improves the error correction results. In one embodiment, an iteration rate that is 8 times the incoming data rate may be used.

A soft input soft output byte-code decoder such as described in FIG. 3 may include vector decoding functions. Vector decoding involves grouping bytes of the data, including systematic and non-systematic bytes. For example, for a rate 1/2 byte code encoded stream, 1 systematic and 1 non-systematic byte will be grouped. The two bytes have over 64,000 possible values. The vector decoder determines or estimates a probability for each of the possible values of the two bytes and creates a probability map. A soft decision is made based on a weighting of the probabilities of some or all of the possibilities and the Euclidean distance to a possible codeword. A hard decision may be made when the error of the Euclidean distance falls below a threshold.

The hard output (i.e. the byte-code decoded information) of the byte-code decoder 350 is provided to the Reed-Solomon decoder 380. The Reed-Solomon decoder 380 forms the output data into packets of, for instance, 207 bytes. The Reed-Solomon decoder 380 considers each sequence of 207 bytes produced by the byte-code decoder 350 as one or more Reed-Solomon codewords and determines if any bytes in the codewords or packets were corrupted due to an error during transmission. The determination is often performed by calculating and evaluating a set of syndromes or error patterns for the codewords. If corruption is detected, the Reed-Solomon decoder 380 attempts to recover the corrupted bytes using the information encoded in the parity bytes. The resulting error-corrected data stream is then thereafter provided to a data decoder 390 that decodes the data stream in accordance with the type of content being transmitted.

The data decoder 390 uses an identifier, such as the PID, in the header of the decoded packet to determine the type of information carried in the packet and how to decode such information. The PID in the header is compared to information in a Program Map Table (PMT) that may be periodically transmitted as part of the data stream and updated in the receiver. The data decoder 390 ignores any packet that has a PID for data packets that are not of a recognized type.

Rugged stream controller 395 also receives the error-corrected data stream. Rugged stream controller 395 may be a separate circuit that is embodied as a microprocessor or microcontroller. Rugged stream controller 395 may alternatively be included in one of the other blocks such as the byte-code decoder 350. Rugged stream controller 395 may also be incorporated into a controller used for the operation of the entire receiving apparatus. Rugged stream controller 395 may determine the presence of a-priori transport packets, for instance, in the form of a preamble used for the rugged data stream. Based on the presence of the a-priori transport packets, rugged stream controller 395 identifies and decodes control information in the rugged data stream.

Decoders, such as described in FIG. 3, may decode a rugged data stream that has been encoded by the byte-code encoders described earlier, including encoding by simple byte-code encoders or concatenated byte-code encoders. The decoder in FIG. 3 describes decoding a rugged data stream encoded by a simple or constituent byte-code encoder involving only a single encoding step. Concatenated byte-code decoding includes decoding the incoming codewords or bytes in more than one decoding step in addition to intermediate processing such as de-interleaving, de-puncturing, and re-insertion.

Figure 4:
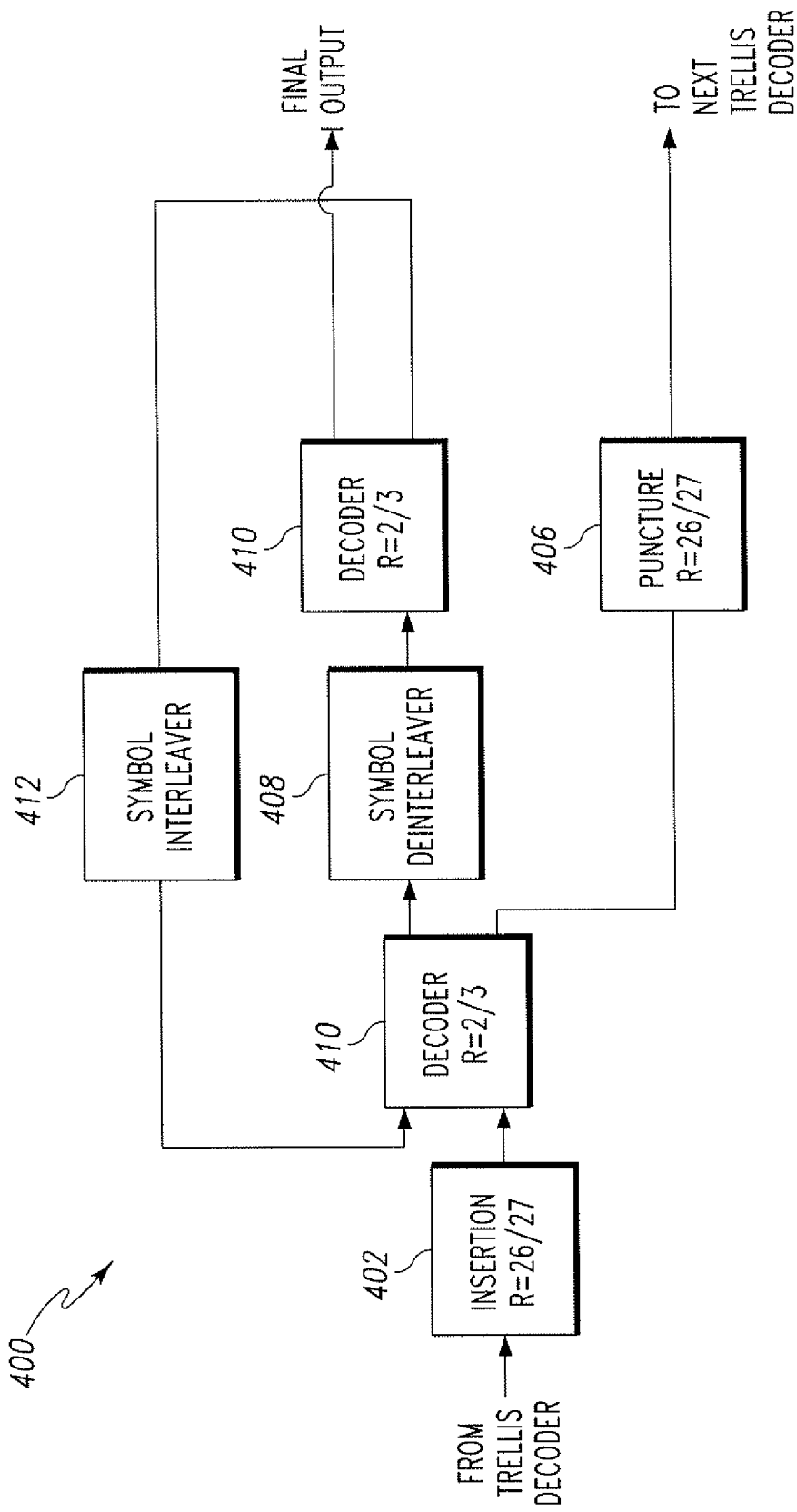
FIG. 4 is a block diagram of an embodiment of a concatenated byte-code decoding circuit of the present disclosure.

Turning now to FIG. 4, a block diagram of an embodiment of a concatenated byte-code decoder 400 is shown. Concatenated byte-code decoder 400 may be used in place of byte-code decoder 350 in FIG. 3. Concatenated byte-code decoder 400 may be configured to operate in a turbo-decoder configuration. Concatenated byte-code decoder 400 also operates internally as a turbo-decoder using an iterative process to decode concatenated byte-code encoded packets in a rugged data stream. Concatenated byte-code decoder 400 is adapted to decode a rate 12/26 byte-code encoded signal stream, producing 12 bytes of data from an originally encoded 26 bytes.

The incoming message data stream, typically representing soft decision values of the 26 bytes is provided to a byte insertion block 402. The output of the byte insertion block 402 is connected to a first 2/3 rate byte-code decoder 404. The first 2/3 rate byte-code decoder 404 provides two outputs. A first output is connected to a puncture block 406, with the output of the puncture block 406 connected as a feedback input to a trellis decoder through an interleaver. The second output of the first 2/3 rate byte-code decoder 404 is connected to a de-interleaver 408. The output of the symbol de-interleaver 408 is connected to a second 2/3 rate decoder 410 also having two outputs. A first output is connected as a feedback input to the first 2/3 rate byte-code decoder 404 through an interleaver 412. The second output is connected to other processing blocks such as a Reed-Solomon decoder.

The 26 byte input to byte insertion block 402 includes the first soft-decisions generated by a trellis decoder regarding the systematic bytes of data or systematic packets and soft-decisions regarding the non-systematic bytes of data or non-systematic packets. The systematic and non-systematic bytes of data may be from packets that have been byte-code encoded. A 2/3 rate byte-code decoder requires 3 bytes in order to decode 2 data bytes. However, the original concatenated encoding removed a byte to reduce the codeword from 27 bytes to 26 bytes by removing, preferably, a non-systematic byte. As a result, a byte is needed to replace the byte removed by the puncturing in the encoding process. Additionally, the trellis decoder does not generate any soft-decisions regarding the punctured byte in the data stream because the input stream to the trellis decoder did not contain the byte. As a result, a soft-decision value is inserted indicating that the value of the punctured byte is equally probable. The first soft-decisions, including the inserted soft-decision value from byte insertion block 402, are provided to first 2/3 rate byte-code decoder 404. The first 2/3 rate byte-code decoder 404 uses the first soft-decisions to generate second soft-decisions based on decoding the bytes of the systematic and non-systematic packets. The generation of the soft decisions utilizes, for instance, the multiplication of a set of bytes by the inverse of the values of the $b_1$ and $b_2$ elements that were used to develop the byte-coded packet as shown in equation (2) and (3) above.

A 27 byte soft output from first 2/3 rate byte-code decoder is provided to puncture block 506. The 27 byte soft output represents an updated set of soft decision values for both the systematic and non-systematic bytes following the decoding in the first 2/3 rate byte-code decoder. Puncture block 506 removes the previously inserted soft decision byte in order to return the byte format to the 26 byte format originally processed by the trellis decoder.

An 18 byte soft output from the first 2/3 rate byte-code decoder representing only systematic bytes is provided to de-interleaver 408. De-interleaver 408 deinterleaves the 18 bytes of data in a manner reversing the interleaving that was performed in the 2/3 rate byte-code encoding process. De-interleaver 408 exactly reverses the interleaving map in the encoder. The de-interleaved bytes are provided to the second 2/3 rate byte-code decoder 510. The second 2/3 rate byte-code decoder 410 uses the de-interleaved soft decision systematic bytes to generate two additional outputs of soft decision bytes in a manner similar to that described above. An 18 byte soft output is provided to interleaver 412. The 18 byte soft output represents a feedback message containing an updated set of soft decision values for both the systematic and non-systematic bytes from the decoding in the first 2/3 rate byte-code decoder 404. Interleaver 412 re-interleaves the de-interleaved bytes in order to place them back into the byte format used by the first 2/3 rate byte-code decoder. Interleaver 412 is essentially identical to the interleaver used in an encoder, such as interleaver 104 in FIG. 1, and provides a re-interleaved set of 18 bytes to the first 2/3 byte-code decoder 404. The re-interleaved set of 18 bytes are used to improve soft decisions made by the first 2/3 rate byte-code decoder 404.

A 12 byte output from the second 2/3 rate byte-code decoder 410 represents the systematic bytes as fully decoded data output for a 12/26 rate byte-code encoded rugged data stream. In a preferred embodiment, if the soft-decisions for the 12 systematic output bytes generated by the second 2/3 rate byte-code decoder 410 are conclusive, or within a predetermined threshold of being conclusive as correct data values, then the second 2/3 rate byte-code decoder 410 uses the soft-decisions to generate hard-decisions regarding the 12 output bytes and provides the 12 output bytes to further processing blocks such as a Reed-Solomon decoder. However, if the soft-decisions generated by the second 2/3 rate byte-code decoder are not conclusive, further iterations are developed as above, using soft information developed and fed back during the previous iteration. This additional soft information is provided to each soft decoder by its succeeding decoder. That is, a trellis decoder uses a feedback message signal from first 2/3 rate byte-code decoder 404 provided through puncture block 406, and first 2/3 rate byte-code decoder 404 uses a feedback message signal from the second 2/3 rate byte-code decoder 410 provided through interleaver 412. The iterations continue in this manner until the soft decisions generated by the second 2/3 rate byte-code decoder 410 sufficiently converge or until a predetermined number of iterations has been undertaken. Turbo-decoding typically utilizes iteration rates related to passing decision data between blocks that are higher than the incoming data rates.

Figure 5:
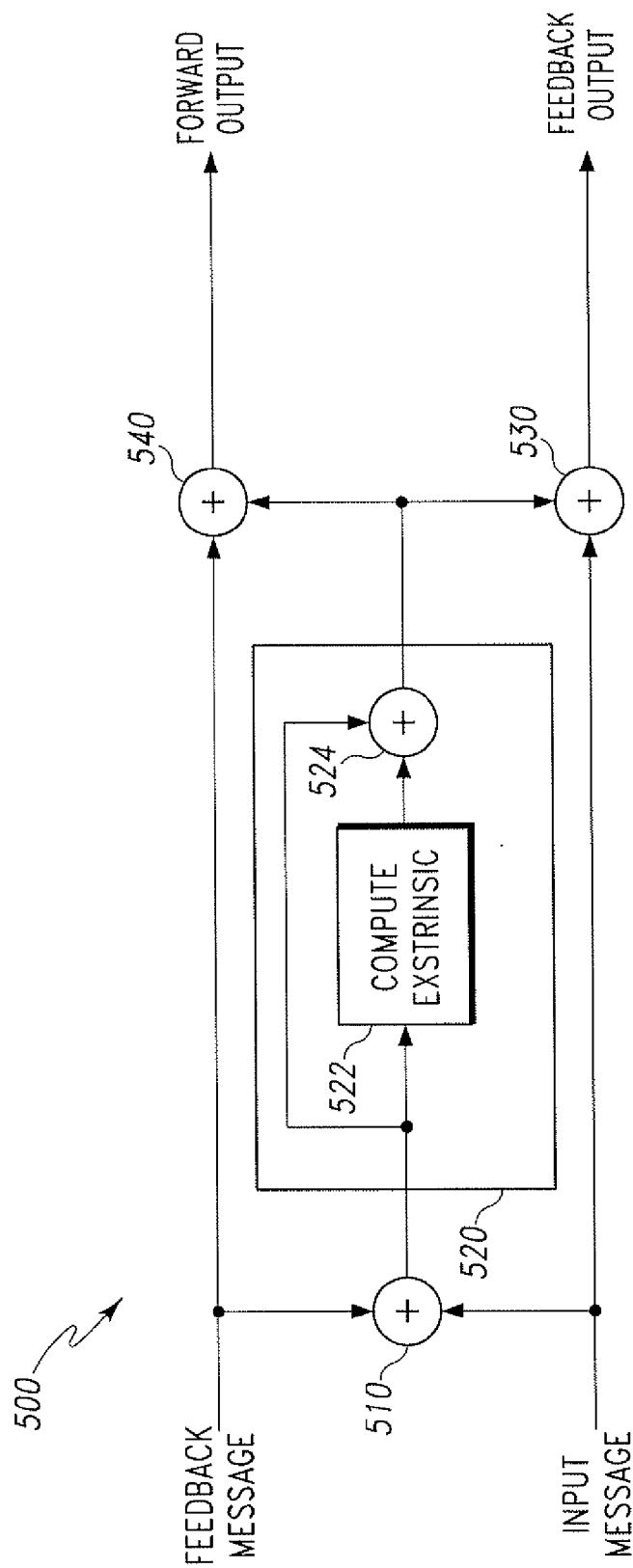
FIG. 5 is a block diagram of an embodiment of a constituent byte-code decoder of the present disclosure.

Turning now to FIG. 5, a block diagram of an embodiment of a constituent byte-code decoder 500 is shown. Constituent byte-code decoder 500 may be used as byte-code decoder 350 shown in FIG. 3 or as decoder 404 and decoder 410 shown in FIG. 4. Byte-code decoder 500 receives two input signals. The first input signal is the incoming message signal primarily from the trellis decoding block. The second input is the feedback message signal fed back from the output of a later decoding stage. Each input is connected to a summer 510. The output of the summer 510 is provided to a core unit 520. Within the core unit 520 the output of summer 510 is connected to an extrinsic computation block 522 and also to one input of summer 524. The output of the extrinsic computation block 522 is connected to the second input of summer 524. The output of summer 524 represents the output of the core unit 520 and is provided as one input of summer 530 and summer 540. The original input message is also provided as an inverted signal to the second input of summer 530. The feedback message is provided as an inverted signal to the second input of summer 530. The outputs of summer 530 and summer 540 represent the outputs of the constituent decoder 500 and are similar the outputs described for decoder 404 and decoder 410 in FIG. 4.

Summer 510 combines the incoming coded message signal with the uncoded feedback message. The summing function typically involves combining the signals based on the particular bits and, more particularly, the particular bit reliabilities for each of the bits in the message signal. The core unit 520 receives the combined message signal and computes extrinsic information in the extrinsic computation block 522 for the incoming bits using the intrinsic reliability information supplied by summer 510. In one embodiment, each incoming bit reliability is processed using the Euclidean distance techniques and inverse values from the generator matrix as describes above. The extrinsic information computed in the extrinsic computation unit 522 is combined or summed together with the input intrinsic information from summer 510 in summer 524 to create the a-posteriori information. The a-posteriori information produced by the core unit 520 represents a combination, or summation, of the original signal message, the feedback message, and the computed extrinsic information.

The summer 540 combines, through a subtraction process, the feedback message signal, supplied from the input, with the a-posteriori information. In a preferred embodiment, the feedback message signal is inverted prior to entering the summer 540. The resulting message signal represents the original coded message from the input along with the added extrinsic information computed in the core unit 520. It is important to note the information message signals are typically conveyed to and from the constituent byte-code decoder 500 as a set of probabilities or reliabilities for the information, both systematic and non-systematic, in the message. In one preferred embodiment, the extrinsic computation block 522 performs logarithmic calculations and the resulting reliabilities at the output of summer 540 are expressed as log likelihood ratios. The incoming message may also be received in the form of a set of log likelihood ratios. The output message reliabilities, based on the bits in the message, are either provided to a further stage in a concatenated byte-code decoder, or alternately represent a final output of the iterative byte-code decoding process and is provided to a further separate decoder.

Similarly, the summer 530 combines, through a subtraction process, the input message signal with the a-posteriori information. In a preferred embodiment, the input message signal is inverted prior to entering the summer 530. The resulting signal represents the feedback message signal along with the added extrinsic information. As above, the information is conveyed as a set of probabilities or reliabilities. The set of coded message reliabilities is supplied as a feedback signal either to a previous byte-code decoder in a concatenated decoder, or alternately as a feedback signal to a previous decoding block, such as a trellis decoder for further iterative decoding improvements.

Constituent byte-code decoder 500 may iteratively process the input message signal based on the byte-code encoding applied in a bit by bit, half nibble by half nibble, or byte by byte manner. As described earlier, the number of iterations allow for an improvement in the reliability of the bit values. The number of iterative processes may be limited by hardware size or hardware speed. Therefore, more efficient architectures and processes are desirable. Improved decoding architectures may be realized by utilizing properties associated with the Galois Field space instead of the serialized direct decoding process as described above. It is important to note that the constituent byte-codes are short linear block codes defined over the Galois Field GF(256). The Galois Field GF(256) is an extension of GF(2) and may be further defined by a primitive polynomial. One preferred primitive polynomial is:

$$P(x) = p_0 + p_1 x + \ldots + p_8 x^8 = 1 + x^2 + x^3 + x^4 + x^8, \text{ with } p_i \in GF(2). \quad (3)$$

The transmitted coded message may be defined as:

$$c = mG, \quad (4)$$

where G may be defined in GF(256) as described by equations (1) and (2) for code rates 1/2 and 2/3 respectively.

However, the generator matrix may be redefined in GF(2) based on the primitive polynomial for code rate 1/2 as:

$$G = [I\ S] \quad (5)$$

In equation 5, I is the identity matrix of size 8×8 and S is a submatrix defined in GF(2) as:

$$S = \begin{bmatrix} 0 & 0 & 0 & 1 & 1 & 1 & 0 & 1 \\ 1 & 0 & 0 & 0 & 0 & 0 & 0 & 0 \\ 0 & 1 & 0 & 0 & 0 & 0 & 0 & 0 \\ 0 & 0 & 1 & 0 & 0 & 0 & 0 & 0 \\ 0 & 0 & 0 & 1 & 0 & 0 & 0 & 0 \\ 0 & 0 & 0 & 0 & 1 & 0 & 0 & 0 \\ 0 & 0 & 0 & 0 & 0 & 1 & 0 & 0 \\ 0 & 0 & 0 & 0 & 0 & 0 & 1 & 0 \end{bmatrix}. \quad (6)$$

Similarly, for code rate 2/3 the generator matrix may be defined in GF(2) based on the primitive polynomial as:

$$G = \begin{bmatrix} I & 0 & S \\ 0 & I & S \end{bmatrix} \quad (7)$$

The matrix equations defined above may further allow the generation of a parity check matrix in GF(2) to recover the original message from the coded message. The parity check equation may be written as:

$$cH^T = 0 \quad (8)$$

The parity check matrix for rate 1/2 code rate may be defined as:

$$H = [S^T\ I] \quad (9)$$

Thus H may be written in matrix form as:

$$H_{C=1/2} = \begin{bmatrix} 0 & 1 & 0 & 0 & 0 & 0 & 0 & 1 & 0 & 0 & 0 & 0 & 0 & 0 & 0 \\ 0 & 0 & 1 & 0 & 0 & 0 & 0 & 0 & 1 & 0 & 0 & 0 & 0 & 0 & 0 \\ 0 & 0 & 0 & 1 & 0 & 0 & 0 & 0 & 0 & 1 & 0 & 0 & 0 & 0 & 0 \\ 1 & 0 & 0 & 0 & 1 & 0 & 0 & 0 & 0 & 0 & 1 & 0 & 0 & 0 & 0 \\ 1 & 0 & 0 & 0 & 0 & 1 & 0 & 0 & 0 & 0 & 0 & 1 & 0 & 0 & 0 \\ 1 & 0 & 0 & 0 & 0 & 0 & 1 & 0 & 0 & 0 & 0 & 0 & 1 & 0 & 0 \\ 0 & 0 & 0 & 0 & 0 & 0 & 0 & 1 & 0 & 0 & 0 & 0 & 0 & 1 & 0 \\ 1 & 0 & 0 & 0 & 0 & 0 & 0 & 0 & 0 & 0 & 0 & 0 & 0 & 0 & 1 \end{bmatrix} \quad (10)$$

Similarly, the parity matrix for rate 2/3 code rate may be defined as:

$$H = [S^T\ S^T\ I] \quad (11)$$

Thus H for rate 2/3 code rate may be written as:

$$H_{C=2/3} = \begin{bmatrix} 0 & 1 & 0 & 0 & 0 & 0 & 0 & 0 & | & 0 & 1 & 0 & 0 & 0 & 0 & 0 & 0 & | & 1 & 0 & 0 & 0 & 0 & 0 & 0 & 0 \\ 0 & 0 & 1 & 0 & 0 & 0 & 0 & 0 & | & 0 & 0 & 1 & 0 & 0 & 0 & 0 & 0 & | & 0 & 1 & 0 & 0 & 0 & 0 & 0 & 0 \\ 0 & 0 & 0 & 1 & 0 & 0 & 0 & 0 & | & 0 & 0 & 0 & 1 & 0 & 0 & 0 & 0 & | & 0 & 0 & 1 & 0 & 0 & 0 & 0 & 0 \\ 1 & 0 & 0 & 0 & 1 & 0 & 0 & 0 & | & 1 & 0 & 0 & 0 & 1 & 0 & 0 & 0 & | & 0 & 0 & 0 & 1 & 0 & 0 & 0 & 0 \\ 1 & 0 & 0 & 0 & 0 & 1 & 0 & 0 & | & 1 & 0 & 0 & 0 & 0 & 1 & 0 & 0 & | & 0 & 0 & 0 & 0 & 1 & 0 & 0 & 0 \\ 1 & 0 & 0 & 0 & 0 & 0 & 1 & 0 & | & 1 & 0 & 0 & 0 & 0 & 0 & 1 & 0 & | & 0 & 0 & 0 & 0 & 0 & 1 & 0 & 0 \\ 0 & 0 & 0 & 0 & 0 & 0 & 0 & 1 & | & 0 & 0 & 0 & 0 & 0 & 0 & 0 & 1 & | & 0 & 0 & 0 & 0 & 0 & 0 & 1 & 0 \\ 1 & 0 & 0 & 0 & 0 & 0 & 0 & 0 & | & 1 & 0 & 0 & 0 & 0 & 0 & 0 & 0 & | & 0 & 0 & 0 & 0 & 0 & 0 & 0 & 1 \end{bmatrix} \quad (12)$$

It is important to note that the parity matrix may be applied to the incoming byte-code coded message in the receiver directly by arranging or grouping the bits for processing through the matrix equation. Furthermore, the parity matrix may be reduced to a set of equations, often referred to as parity check equations, with each equation only involving certain bits of the incoming message. The equations may be processed and solved as a set of simultaneous equations in order to determine the final values or likelihoods for the bits in the grouping or subset of the message. Decoders, and in particular byte-code decoders, that utilize arrangements of the incoming bits into parity equations or alternately a parity matrix will become more evident with the embodiments described below.

Figure 6:
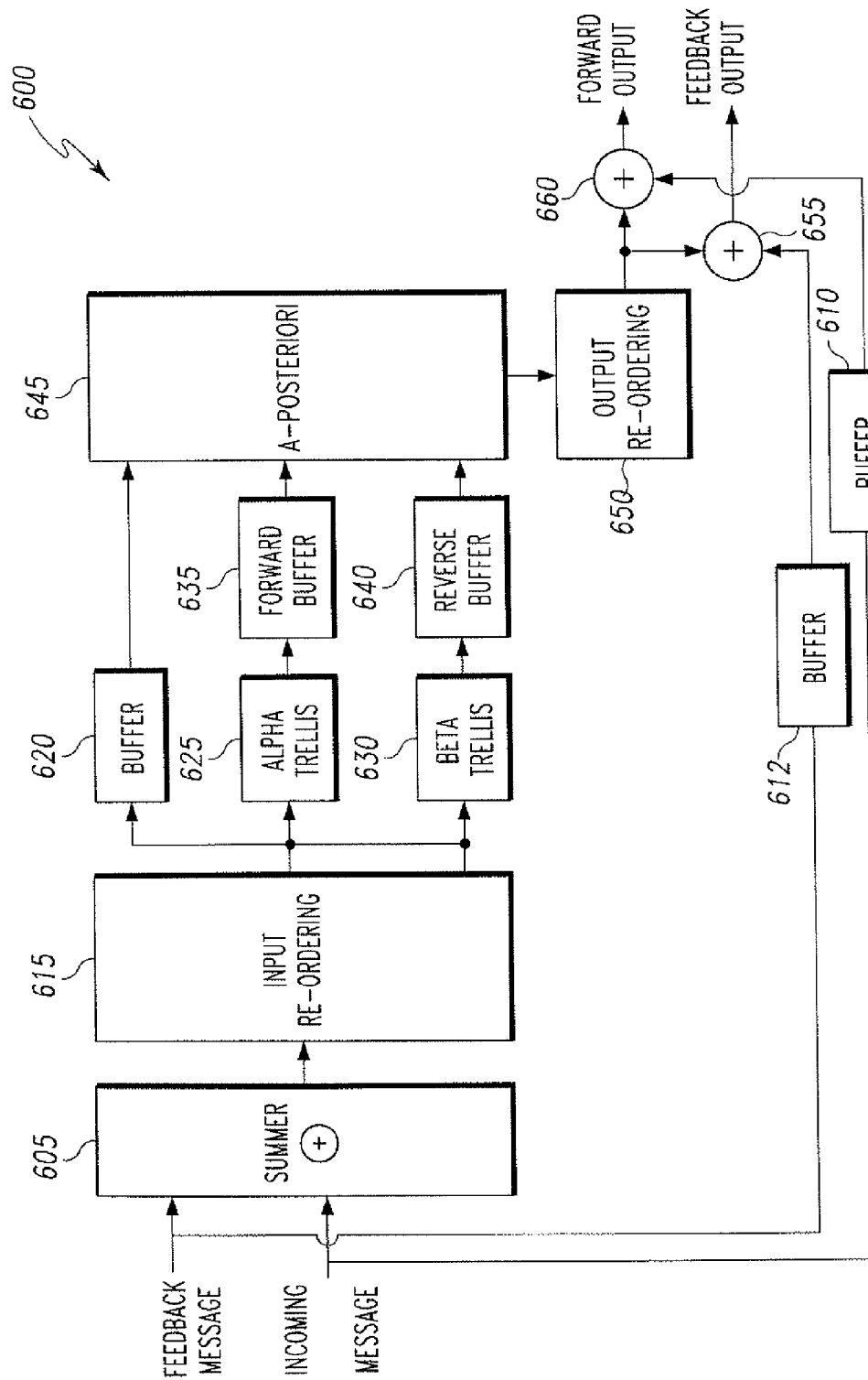
FIG. 6 is a block diagram of another embodiment of a constituent byte-code decoder of the present disclosure.

Turning now to FIG. 6, a block diagram of another embodiment of a constituent byte-code 600 decoder using aspects of the present disclosure is shown. Constituent byte-code decoder 600 may be used in place of the decoder 404 and decoder 410 in FIG. 4. Two input signals, an incoming message signal and a feedback message signal, are provided as inputs to summer 605. The output of summer 605 is connected to input bit reordering block 615. A first output of the input reordering block 615 is connected to a delay buffer 620 and to an alpha trellis block 625. A second output of the input reordering block 615 is connected to a beta trellis block 630. The output of the alpha trellis block 625 is connected to a memory buffer 635. The output of the beta trellis block 630 is connected to a memory buffer 640. The outputs of the delay buffer 620, memory buffer 635, and memory buffer 640 are all connected to a-posteriori processor 645. The output of a-posteriori processor 645 is connected to output reordering block 650. The output of the output reordering block 650 is connected to one input of both summer 655 and summer 660. The coded message signal is also connected to a delay buffer 610. The output of the delay buffer 610 is inverted and connected to the other input of summer 655. The feedback message signal is also connected to a delay buffer 612. The output of delay buffer 612 is inverted and connected to the other input of summer 660. The outputs of summer 655 and summer 660 represent the outputs of the constituent decoder 600 similar to those described for constituent byte-code decoder 500 in FIG. 5.

The summer 605 receives two inputs, the input message signal and the feedback message signal, and combines or adds the reliabilities for the signals. The input reordering block 615 groups the combined message signal into a subset of bits, changes the serial ordering of the bits in the signal, and provides the reordered input signals to the alpha trellis block 625 and the beta trellis block 630. Reordering may be performed in order to improve the efficiency of the decoder and will be described in further detail below. The subset size chosen may be a function of the parity check process used. In a preferred embodiment, the subset size is 16 bits, identified as vector $b=[b_0 b_1 b_2 b_3 b_4 b_5 b_6 b_7 b_8 b_9 b_{10} b_{11} b_{12} b_{13} b_{14} b_{15}]$. The input reordering block 615 produces a forward reordered output, first re-ordered bit to last re-ordered bit, that is provided to the alpha trellis block 625 and also to the buffer 620. The buffer 620 provides a timing delay of the forward reordered output, also representative of the intrinsic signal, to allow recombination after trellis processing. The input reordering block 615 also produces a reverse order signal, last re-ordered bit to first re-ordered bit, and provides the signal to the alpha trellis block 630.

The alpha trellis block 625 and beta trellis block 630 compute the forward metric and reverse metric values based on the generation processing of a set of computations known as of a trellis tree or trellis diagram. The particular implementation of the trellis tree or trellis diagram and the operation of the alpha trellis block 625 and beta trellis block 630 will be described in further detail below. The forward buffer 635 and reverse buffer 640 receive the outputs of the alpha trellis block 635 and beta trellis block 640. The forward buffer 635 and reverse buffer 640 provide timing delay for recombination. In addition, the reverse buffer 640 reverses the bit order of the output of the beta trellis block 640.

The forward and reverse metric values from alphas trellis block 625 and beta trellis block 630 are combined with the intrinsic information in the a-posteriori block 645. The a-posteriori block 645 computes the a-posteriori reliabilities for the subset of bits in the message stream. The output reordering block 650 re-orders the a-posteriori reliability information for the subset in order to return the subset to its original order. Summer 655 and summer 660 combine the feedback message and input message, each inverted for subtraction, with the re-ordered a-posteriori message signal. Buffer 610 and buffer 612 provide the necessary timing delay of the input message and feedback message in order to allow proper combining with the a-posteriori reliability information output. It is important to note that the forward output of summer 660 and coded feedback output of summer 655 represent the forward output value and feedback output value and are functionally similar to the outputs described for constituent byte-code decoder 500 in FIG. 5.

Constituent byte-code decoder 600 decodes the incoming message using a log-MAP decoder based on trellis decoding a re-ordered subset of bits in the message. One possible trellis algorithm utilizes the Bahl-Cooke-Jelinek-Raviv (BCJR) algorithm. In order to apply log-MAP decoding using trellis mapping, the incoming message is transformed into an equivalent bit trellis tree based on a set of parity equations formed from the parity matrix described earlier. For the rate 1/2 code, the following set of numbered equations may be used:

$$b_1+b_8=0 \tag{1}$$

$$b_2+b_9=0 \tag{2}$$

$$b_3+b_{10}=0 \tag{3}$$

$$b_0+b_4+b_{11}=0 \tag{4}$$

$$b_0+b_5+b_{12}=0 \tag{5}$$

$$b_0+b_6+b_{13}=0 \tag{6}$$

$$b_7+b_{14}=0 \tag{7}$$

$$b_0+b_{15}=0 \tag{8}$$

The bit based trellis algorithm allows processing the bits in any particular order of increasing depth looking at the formed trellis tree from left to right. Once a bit is chosen at a given depth, all parity check equations that involve that bit become active. If all bits in a given parity check equation have been processed, then that parity check equation is no longer active. The current state of the parity check equations at a given depth are concatenated to form an n-bit state, where n is the current number of active parity check equations. Some of the active parity check equations may be at an identical state, so only one bit is necessary for these equations. Efficient decoding is possible using a bit ordering that processes the bits in such a way that the maximum number of equations n over all depths is as small as possible. A preferred bit trellis tree is shown in FIG. 7.

Figure 7:
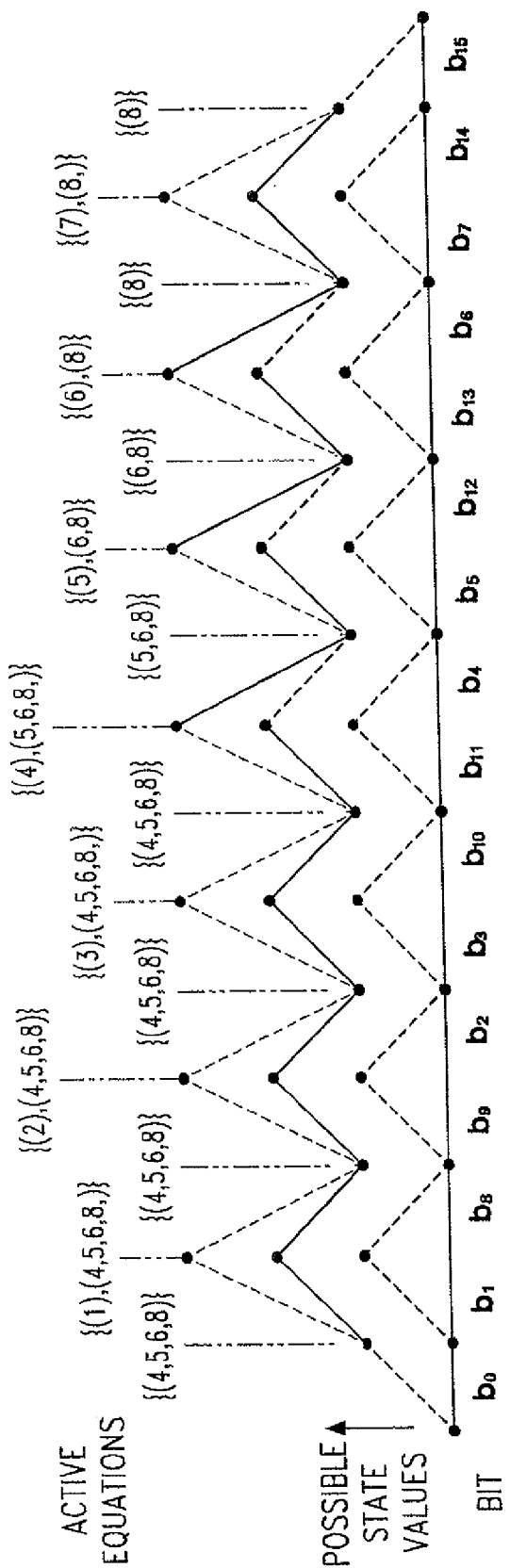
FIG. 7 is a diagram illustrating an embodiment of a trellis tree for a decoder of the present disclosure.

In FIG. 7, the lower x-axis shows the bit order implemented in the input bit re-ordering block 615. The forward order is shown from left to right on the axis, while the reverse order is shown from right to left. The upper x-axis shows the number of equations used at each bit transition or state change. The solid line shows a transition between the previous bit and the next bit when the next bit has a value, or probable value, of 0. The dashed line shows a transition between the previous bit and the next bit when the next bit has a value, or probable value, of 1.

The bit trellis tree for a rate 2/3 code rate may be formed in a similar way using the following set of numbered parity check equations based on a subset size of 24 bits.

$$b_1+b_9+b_{16}=0 \tag{1}$$

$$b_2+b_{10}+b_{17}=0 \tag{2}$$

$$b_3+b_{11}+b_{18}=0 \tag{3}$$

$$b_0+b_4+b_8+b_{12}+b_{19}=0 \tag{4}$$

$$b_0+b_5+b_8+b_{13}+b_{20}=0 \tag{5}$$

$$b_0+b_6+b_8+b_{14}+b_{21}=0 \quad (6)$$

$$b_7+b_{15}+b_{22}=0 \quad (7)$$

$$b_0+b_8+b_{23}=0 \quad (8)$$

Figure 8:
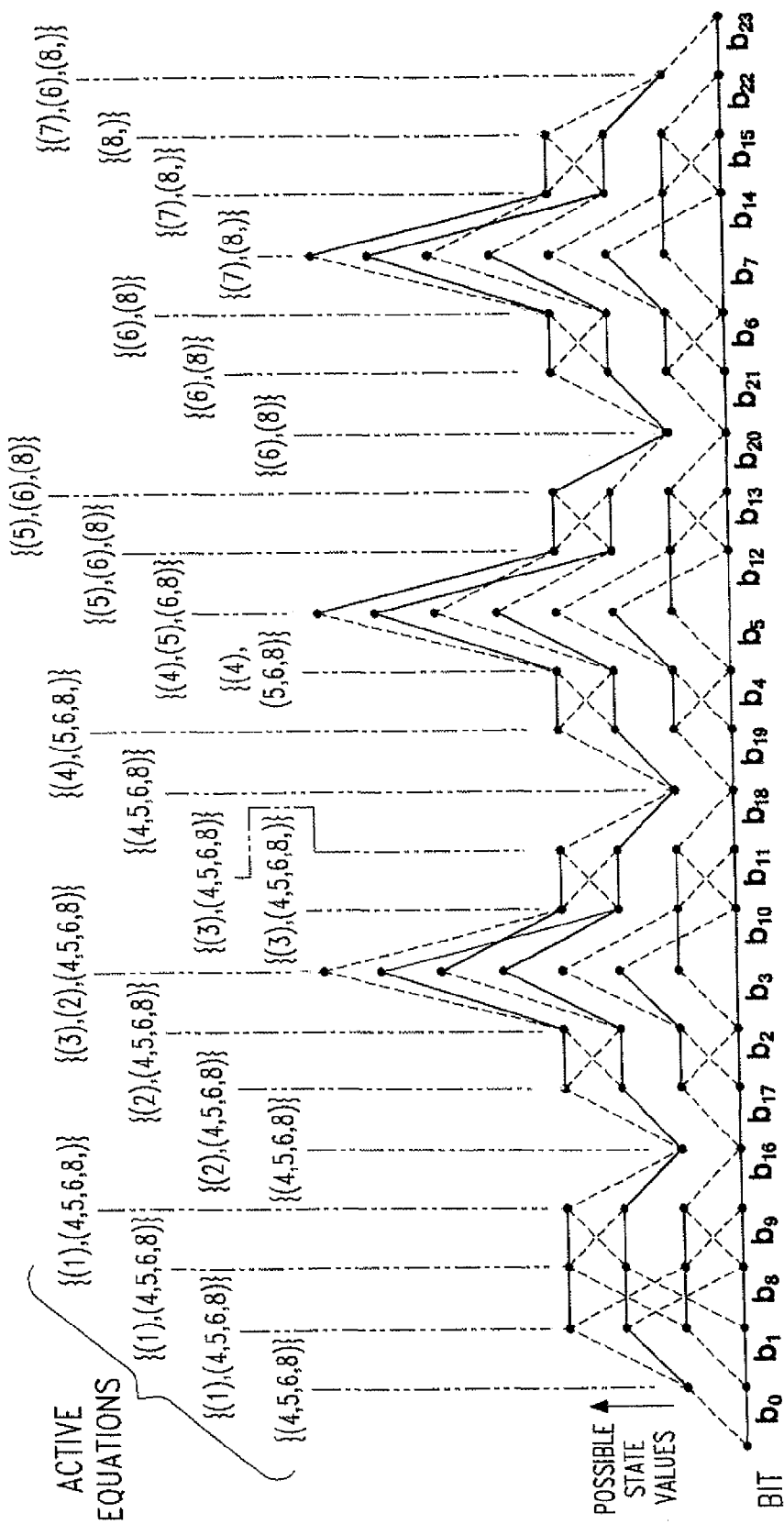
FIG. 8 is a diagram illustrating another embodiment of a trellis tree for a decoder of the present disclosure.

A preferred trellis tree for the rate 2/3 code rate is shown in FIG. 8 and can be described in a manner similar to that described for the trellis tree shown in FIG. 7.

It is important to note that alternative parity check arrangements may be used with respect to the decoding process described above. For instance, a smaller subset of bits may be used. As a result, it may be possible to decode the smaller subset of bits using a single relationship between two of the bits. The smaller subset of bits and the single relationship, in the form of a parity relationship may be iteratively decoded or the bits may be added and removed from the subset and a different parity equation, as a single relationship may be used in the subsequent decoding step.

The constituent byte-code decoder 600 may also allow other groupings of bits. For instance, in addition to the grouping to form a subset of 16 or 24 bits, a second grouping may be formed by grouping the bits based on the relationship of the bits to the received transmission or modulation symbols. The additional grouping provides a further improvement in the decoding process by including additional intrinsic information associated with the bits in the incoming message. Constituent byte-code decoder receives and processes message information based on constellation values for each symbol containing 2 bits of the message, further representing 4 potential values. Each bit constellation position in one symbol is represented by one reliability value. Therefore one symbol, which consists of 2 bits, may be represented as 4 probabilities identified as:

$$P(x_{symbol}=\text{``00''}), P(x_{symbol}=\text{``01''}), P(x_{symbol}=\text{``10''}), P(x_{symbol}=\text{``11''})$$

It is important to note that the bit to symbol relationships and mapping, and the subsequent symbol metric value generation, may be performed in a previous processing stage, such as the trellis decoder 320 in FIG. 3. The symbol metric values and symbol mapping may then be provided to the input of constituent byte-code decoder 600. The bit to symbol mapping and metric value generation may also be performed as part of the input processing in byte-code decoder 600, such as in the summer block 605 or input re-ordering block 610, or in a separate processing block, not shown. Additionally, the symbol probabilities may be maintained, processed, and output from the byte-code decoder 600 in the same manner as described for the bit probabilities in the message as described above.

The corresponding symbol trellis is formed by collapsing the depths at bits of the same symbol to a single depth by considering the intermediate transition. If the binary representation of the symbol $s_n$ is "$b_{2n}b_{2n+1}$", then for instance a symbol $s_0=3=\text{``11''}$ causes a transition from state 0 to state 3 by way of state 1, $s_0=2=\text{``10''}$ causes a transition from state 0 to state 2 by way of state 1, $s_0=1=\text{``01''}$ causes a transition from state 0 to state 1 by way of state 0, and $s_0=0=\text{``00''}$ causes a transition from state 0 to state 0 by way of state 0. The pattern is continued until the entire symbol trellis for all possible states is formed.

Figure 9:
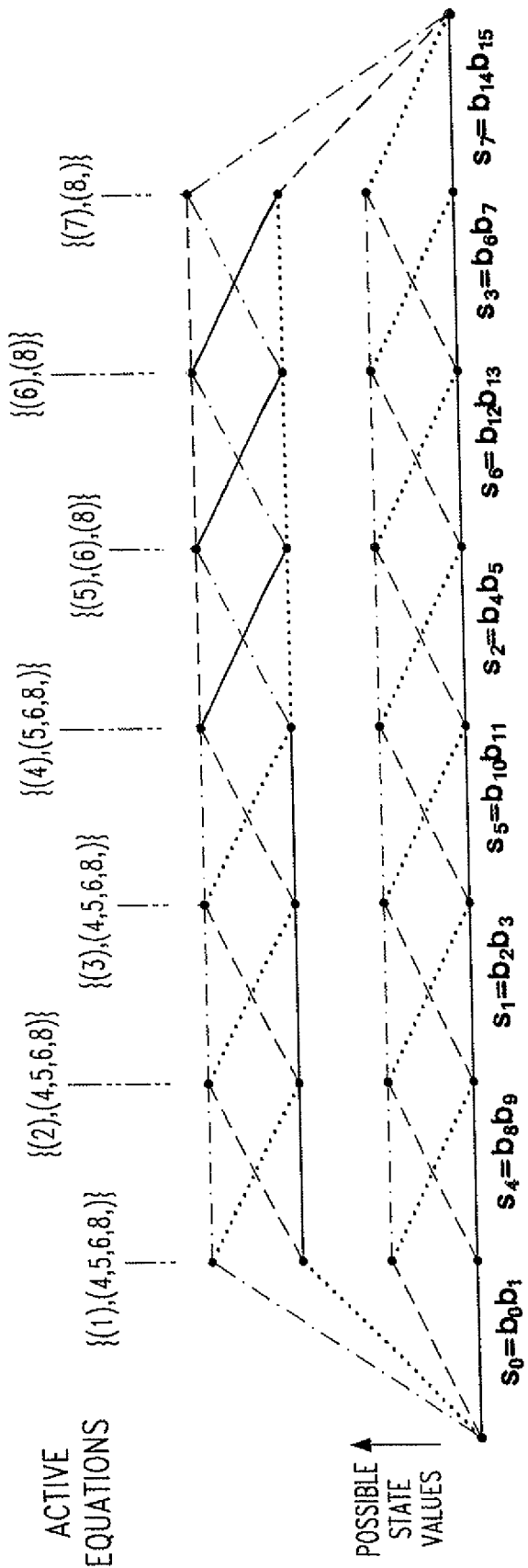
FIG. 9 is a diagram illustrating a further embodiment of a trellis tree for a decoder of the present disclosure.

A preferred trellis tree for rate 1/2 code rate symbol based trellis decoding is shown in FIG. 9. In FIG. 9, the lower axis show the reordered symbols labeled $S_0$ to $S_7$ and the corresponding bits associated with each symbol. As described above, the forward order is shown from left to right and the reverse order is shown from right to left. The upper axis shows the number of parity check equations, described earlier for the rate 1/2 code bit based trellis tree, used at each symbol transition or state change. The solid line shows a transition between the previous symbol to the next symbol when the next symbol has a value, or probable value, of "00". The dashed line shows a transition between the previous symbol to the next symbol when the next symbol has a value, or probable value, of "01". The dotted line shows a transition between the previous symbol to the next symbol when the next symbol has a value, or probable value, of "10". Finally, the dotted dashed line shows a transition between the previous symbol to the next symbol when the next symbol has a value, or probable value, of "11".

Figure 10:
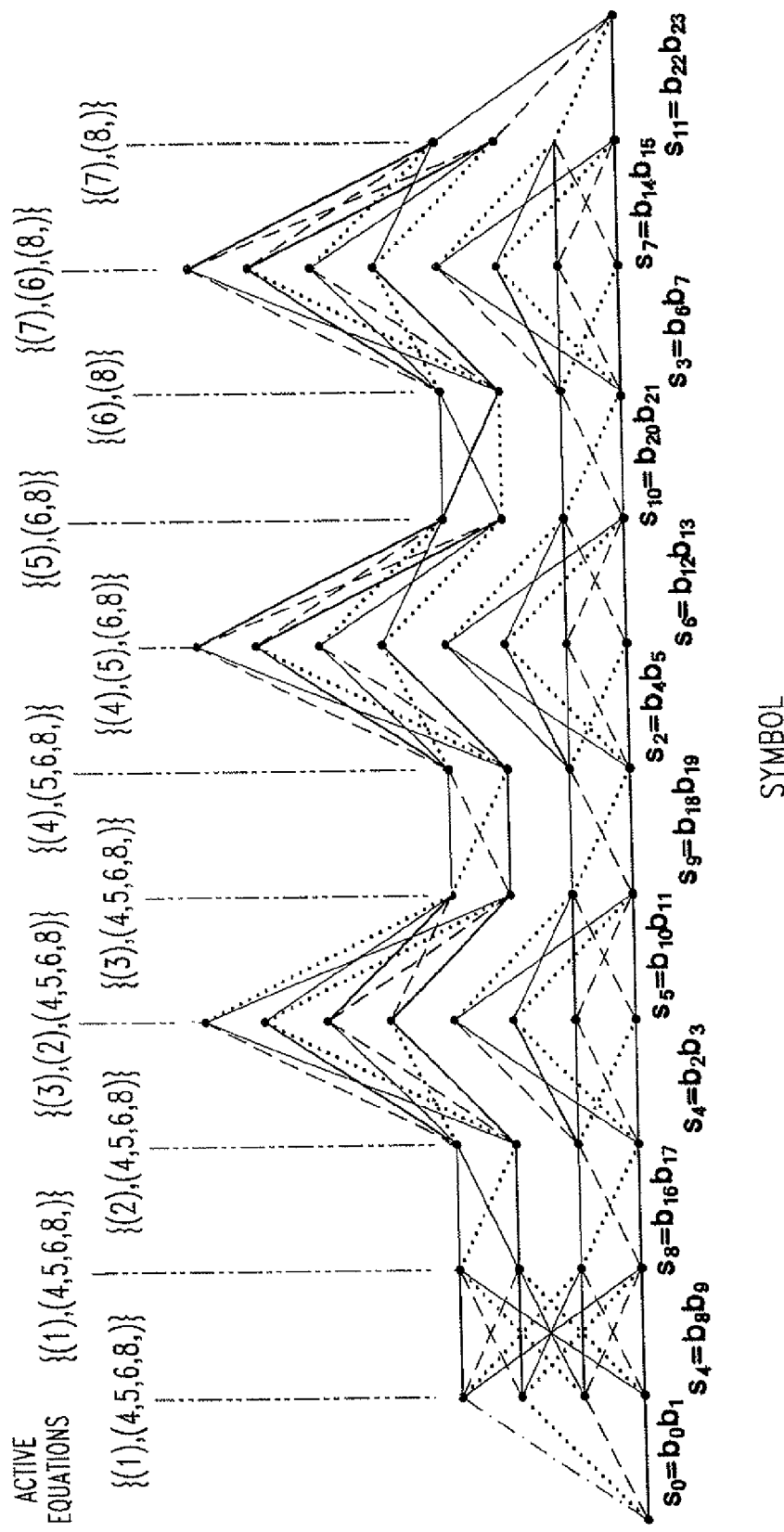
FIG. 10 is a diagram illustrating yet another embodiment of a trellis tree for a decoder of the present disclosure.

Similarly, a preferred trellis tree for rate 2/3 code rate symbol based trellis decoding is shown in FIG. 10, using a bit grouping subset of 24 bits. The lower axis show the reordered symbols labeled $S_0$ to $S_{12}$ and the corresponding bits associated with each symbol. The upper axis shows the number of parity check equations, described earlier for the rate 2/3 code bit based trellis tree, used at each symbol transition or state change. The line transitions are labeled the same as in FIG. 9.

Figure 11A:
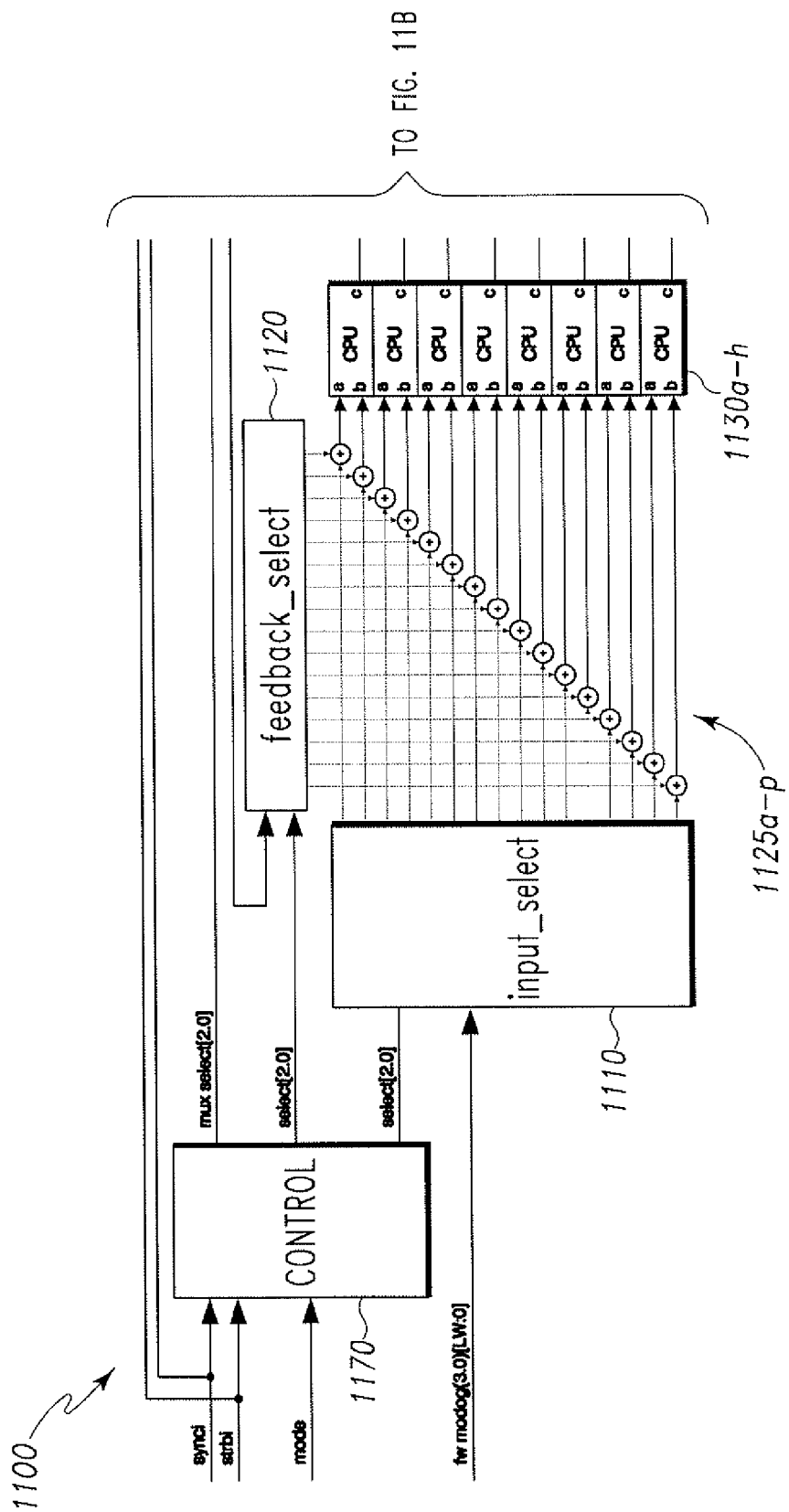
FIG. 11A and FIG. 11B are a block diagram of an embodiment of trellis block for a decoder of the present disclosure.
Figure 11B:
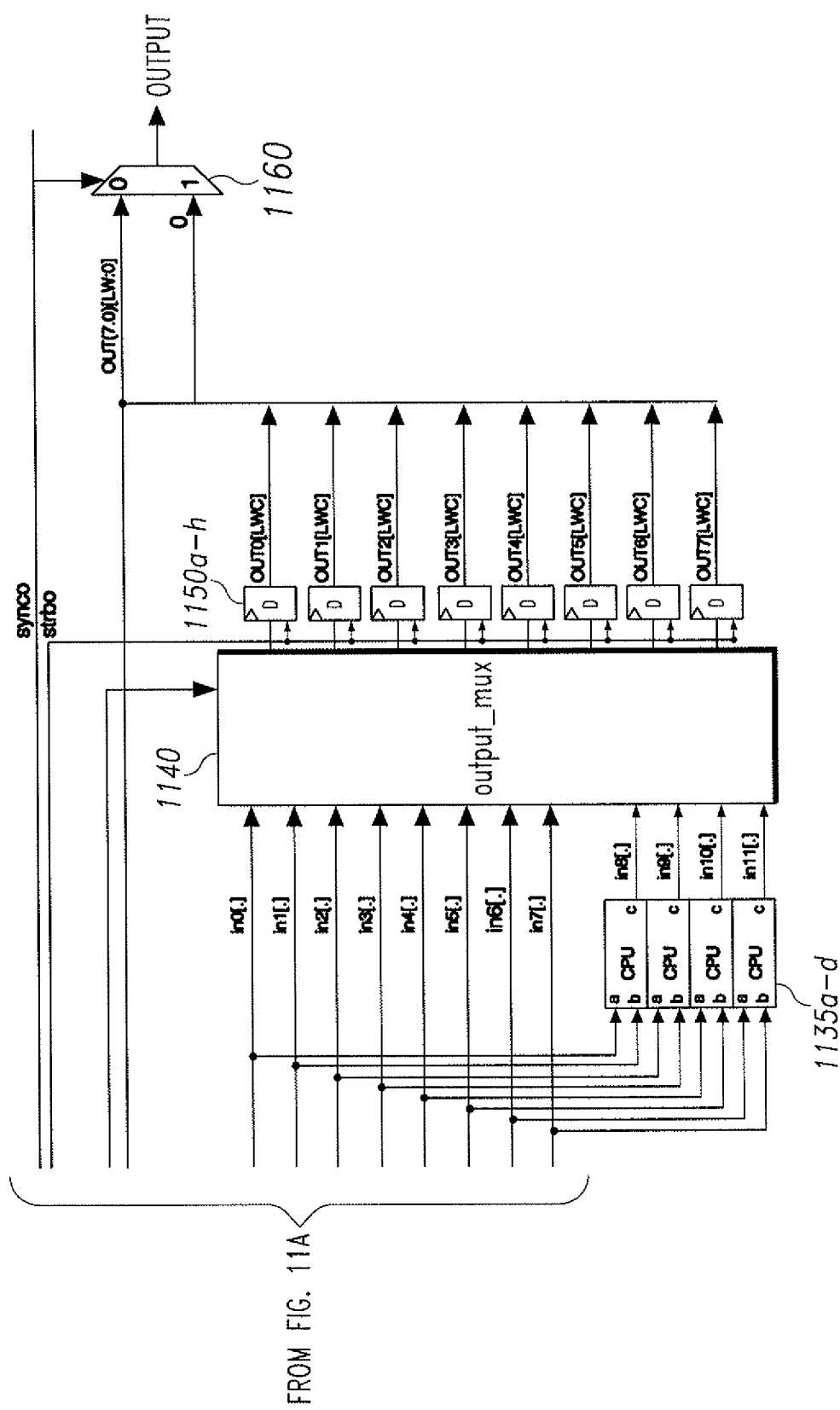

Turning now to FIG. 11A and FIG. 11B, a block diagram of embodiment of a trellis block 1100 used in a constituent byte-code decoder using aspects of the present disclosure is shown. Trellis block 1100 may be used to implement either the alpha trellis block 625 or the beta trellis block 630 in FIG. 6. The alpha trellis block 625 may use a different control sequence from the beta trellis block 630 as will be described further below. Further, as described below, each block may implement a different metric calculation in the evaluation of the trellis tree.

In trellis block 1100, the message signal provided to the trellis block 1100 is connected an input_select block 1110. A series of adders 1125a-p combine the selected portions (i.e. bits or symbols) of the input message and portions (i.e. bits or symbols) of a metric computation output that are selected through the feedback_select block 1120. The metric computation is performed in the core process units 1130a-h and 1135a-d. Metric computations, as implemented for the alpha trellis block 625 and beta trellis block 630, will be described further below.

Each of the computed metrics from the core process units 1130a-h and 1135a-d is connected to an output_mux 1140. The outputs from the output_mux 1140 are buffered through D_buffers 1150a-h. The D_buffers 1150 a-h provide the computed metric values to the feedback_select block 1120.

The selection and multiplexing operations performed by input_select block 1110, feedback_select block 1120, and output_mux 1140 are controlled by the control block 1170. Trellis block 1100 also include sync clock and strobe signals, a disable mux 1160 for deactivated the block when not in use, and a code rate mode input signal, for selecting the decoding code rate, that is provided to the control block 1170.

The forward metric generated by the alpha trellis block 625 starts on the left side of the trellis tree and proceeds with processing towards the right side. The forward metric computation of the trellis tree for the alpha trellis block 625 is:

$$\alpha_{n+1}^k=\log(e^{\alpha_n^j+L_n^j}) \quad (13)$$

In equation 14, $L_n^j$ is the metric of branch j of the nth symbol. For example the metric computation for the symbol n that has a value "00" is denoted as $L_n^0$. The metric of state k of the nth symbol is denoted as $\alpha_n^k$. Referring to FIG. 9, the forward metric of the trellis tree may be evaluated as:

$$\alpha_0^k=0 \forall k=0,1\ldots 3$$

$$\alpha_1^0=\log(e^{\alpha_0^0+L_0^0})$$

$$\alpha_1^1 = \log(e^{\alpha_0^0 + L_0^1})$$

$$\alpha_1^2 = \log(e^{\alpha_0^0 + L_0^2})$$

$$\alpha_1^3 = \log(e^{\alpha_0^0 + L_0^3})$$

$$\alpha_2^0 = \log(e^{\alpha_1^0 + L_1^0} + e^{\alpha_1^1 + L_1^1} + e^{\alpha_1^2 + L_1^2} + e^{\alpha_1^3 + L_1^3})$$

$$\alpha_2^1 = \log(e^{\alpha_1^0 + L_1^1} + e^{\alpha_1^1 + L_1^0} + e^{\alpha_1^2 + L_1^3} + e^{\alpha_1^3 + L_1^2})$$

$$\alpha_2^2 = \log(e^{\alpha_1^0 + L_1^2} + e^{\alpha_1^1 + L_1^3} + e^{\alpha_1^2 + L_1^0} + e^{\alpha_1^3 + L_1^1})$$

$$\alpha_2^3 = \log(e^{\alpha_1^0 + L_1^3} + e^{\alpha_1^1 + L_1^2} + e^{\alpha_1^2 + L_1^1} + e^{\alpha_1^3 + L_1^0})$$

$$\vdots$$

$$\alpha_{12}^0 = \log(e^{\alpha_{11}^0 + L_{11}^0} + e^{\alpha_{11}^1 + L_{11}^2} + e^{\alpha_{11}^2 + L_{11}^1} + e^{\alpha_{11}^3 + L_{11}^3})$$

(14)

In general, the core computation implemented in the core process units may be evaluation as:

$$c = \log(e^a + e^b + e^c) \quad (15)$$

In equation 16, a, b, and c are representative of the exponential coefficients shown in in equation 15 and are shown as signal labels at the core process units 1130a-h and 1135a-d. In order to improve the computation speed, the core process units 1130a-h and 1135a-d implement the computation iteratively as:

$$c = \log(e^{\log(e^a + e^b)} + e^c). \quad (16)$$

As described above, even though a common architecture may be shared as described by trellis block 1100, the alpha trellis block 625 may implement a different control sequence from the beta trellis block 630. The control sequence may be derived from the trellis code and trellis diagram that is used. In a preferred embodiment, the control sequence for the input_select block 1110, feedback_select block 1120, and output_mux 1140 used as part of the alpha trellis block 625 may be implemented as shown in Table 1:

TABLE 1

| Mode | Clock | alpha_select[2:0] | alpha_alpha_select | | | | | | | | | | | | | | | | | |
|---|---|---|---|---|---|---|---|---|---|---|---|---|---|---|---|---|---|---|---|---|
| | | | alpha 0 | | | | alpha 1 | | | | alpha 2 | | | | alpha 3 | | | | 4 | |
| 1 (C = 2/3) | 1 | 0 | | | | | | | | | | | | | | | | | | |
| | 2 | 1 | 0 | 1 | 2 | 3 | 0 | 1 | 2 | 3 | 0 | 1 | 2 | 3 | 0 | 1 | 2 | 3 | | |
| | 3 | 2 | 0 | 1 | | | 0 | 1 | | | 2 | 3 | | | 2 | 3 | | | | |
| | 4 | 3 | 0 | 1 | | | 0 | 1 | | | 0 | 1 | | | 0 | 1 | | | 2 | 3 |
| | 5 | 4 | 0 | 1 | 2 | 3 | 0 | 1 | 2 | 3 | 4 | 5 | 6 | 7 | 4 | 5 | 6 | 7 | | |
| | 6 | 2 | 0 | 1 | | | 0 | 1 | | | 2 | 3 | | | 2 | 3 | | | | |
| | 7 | 3 | 0 | 1 | | | 0 | 1 | | | 0 | 1 | | | 0 | 1 | | | 2 | 3 |
| | 8 | 4 | 0 | 1 | 2 | 3 | 0 | 1 | 2 | 3 | 4 | 5 | 6 | 7 | 4 | 5 | 6 | 7 | | |
| | 9 | 2 | 0 | 1 | | | 0 | 1 | | | 2 | 3 | | | 2 | 3 | | | | |
| | 10 | 3 | 0 | 1 | | | 0 | 1 | | | 0 | 1 | | | 0 | 1 | | | 2 | 3 |
| | 11 | 4 | 0 | 1 | 2 | 3 | 0 | 1 | 2 | 3 | 4 | 5 | 6 | 7 | 4 | 5 | 6 | 7 | | |
| | 12 | 5 | 0 | 1 | 2 | 3 | | | | | | | | | | | | | | |
| 0 (C = 1/2) | 1 | | | | | | | | | | | | | | | | | | | |
| | 2 | 2 | 0 | 1 | | | 0 | 1 | | | 2 | 3 | | | 2 | 3 | | | | |
| | 3 | 2 | 0 | 1 | | | 0 | 1 | | | 2 | 3 | | | 2 | 3 | | | | |
| | 4 | 2 | 0 | 1 | | | 0 | 1 | | | 2 | 3 | | | 2 | 3 | | | | |
| | 5 | 2 | 0 | 1 | | | 0 | 1 | | | 2 | 3 | | | 2 | 3 | | | | |
| | 6 | 2 | 0 | 1 | | | 0 | 1 | | | 2 | 3 | | | 2 | 3 | | | | |
| | 7 | 2 | 0 | 1 | | | 0 | 1 | | | 2 | 3 | | | 2 | 3 | | | | |
| | 8 | 5 | 0 | 1 | 2 | 3 | | | | | | | | | | | | | | |

| Mode | Clock | alpha_alpha_select | | | fw_select[2:0] | alpha_fw_select | | | | | | | | | |
|---|---|---|---|---|---|---|---|---|---|---|---|---|---|---|---|
| | | 5 | 6 | 7 | | alpha 0 | | | | alpha 1 | | | | alpha 2 | | |
| 1 (C = 2/3) | 1 | | | | 0 | 0 | | | | 1 | | | | 2 | | |
| | 2 | | | | 1 | 0 | 1 | 2 | 3 | 1 | 0 | 3 | 2 | 2 | 3 | 0 | 1 |
| | 3 | | | | 2 | 0 | 2 | | | 1 | 3 | | | 0 | 2 | | |
| | 4 | 2 | 3 | 2 | 3 | 2 | 3 | 3 | 0 | 2 | | | 1 | 3 | | | 2 | 0 |
| | 5 | | | | 4 | 0 | 1 | 2 | 3 | 1 | 0 | 3 | 2 | 0 | 1 | 2 | 3 |
| | 6 | | | | 2 | 0 | 2 | | | 1 | 3 | | | 0 | 2 | | |
| | 7 | 2 | 3 | 2 | 3 | 2 | 3 | 3 | 0 | 2 | | | 1 | 3 | | | 2 | 0 |
| | 8 | | | | 1 | 0 | 1 | 2 | 3 | 1 | 0 | 3 | 2 | 2 | 3 | 0 | 1 |
| | 9 | | | | 5 | 0 | 2 | | | 1 | 3 | | | 2 | 0 | | |
| | 10 | 2 | 3 | 2 | 3 | 2 | 3 | 3 | 0 | 2 | | | 1 | 3 | | | 2 | 0 |
| | 11 | | | | 1 | 0 | 1 | 2 | 3 | 1 | 0 | 3 | 2 | 2 | 3 | 0 | 1 |
| | 12 | | | | 6 | 0 | 2 | 1 | 3 | | | | | | | | |
| 0 (C = 1/2) | 1 | | | | 0 | 0 | | | | 1 | | | | 2 | | |
| | 2 | | | | 2 | 0 | 2 | | | 1 | 3 | | | 0 | 2 | | |
| | 3 | | | | 2 | 0 | 2 | | | 1 | 3 | | | 0 | 2 | | |
| | 4 | | | | 2 | 0 | 2 | | | 1 | 3 | | | 0 | 2 | | |
| | 5 | | | | 5 | 0 | 2 | | | 1 | 3 | | | 2 | 0 | | |
| | 6 | | | | 5 | 0 | 2 | | | 1 | 3 | | | 2 | 0 | | |
| | 7 | | | | 5 | 0 | 2 | | | 1 | 3 | | | 2 | 0 | | |
| | 8 | | | | 6 | 0 | 2 | 1 | 3 | | | | | | | | |

| Mode | Clock | alpha_fw_select | | | | | alpha_mux | |
|---|---|---|---|---|---|---|---|---|
| | | alpha 3 | 4 | 5 | 6 | 7 | alpha_mux_select[2:] | alpha[7:0][..] |
| 1 (C = 2/3) | 1 | 3 | | | | | 0 | in[3:0][..] |
| | 2 | 3 | 2 | 1 | 0 | | 1 | in[11:8][..] |

TABLE 1-continued

|  |  |  |  |  |  |  |  |  |  |  |  |  |  |  |
|---|---|---|---|---|---|---|---|---|---|---|---|---|---|---|
|  | 3 | 1 | 3 |  |  |  |  |  |  |  |  |  | 0 | in[3:0][..] |
|  | 4 | 3 | 1 |  |  | 0 | 2 | 1 | 3 | 2 | 0 | 3 | 1 | 2 | in[7:0][..] |
|  | 5 | 1 | 0 | 3 | 2 |  |  |  |  |  |  |  |  | 1 | in[11:8][..] |
|  | 6 | 1 | 3 |  |  |  |  |  |  |  |  |  | 0 | in[3:0][..] |
|  | 7 | 3 | 1 |  |  | 0 | 2 | 1 | 3 | 2 | 0 | 3 | 1 | 2 | in[7:0][..] |
|  | 8 | 3 | 2 | 1 | 0 |  |  |  |  |  |  |  |  | 1 | in[11:8][..] |
|  | 9 | 3 | 1 |  |  |  |  |  |  |  |  |  | 0 | in[3:0][..] |
|  | 10 | 3 | 1 |  |  | 0 | 2 | 1 | 3 | 2 | 0 | 3 | 1 | 2 | in[7:0][..] |
|  | 11 | 3 | 2 | 1 | 0 |  |  |  |  |  |  |  |  | 1 | in[11:8][..] |
|  | 12 |  |  |  |  |  |  |  |  |  |  |  |  | 3 | in[8][..] |
| 0 (C = ½) | 1 | 3 |  |  |  |  |  |  |  |  |  |  |  | 0 | in[3:0][..] |
|  | 2 | 1 | 3 |  |  |  |  |  |  |  |  |  | 0 | in[3:0][..] |
|  | 3 | 1 | 3 |  |  |  |  |  |  |  |  |  | 0 | in[3:0][..] |
|  | 4 | 1 | 3 |  |  |  |  |  |  |  |  |  | 0 | in[3:0][..] |
|  | 5 | 3 | 1 |  |  |  |  |  |  |  |  |  | 0 | in[3:0][..] |
|  | 6 | 3 | 1 |  |  |  |  |  |  |  |  |  | 0 | in[3:0][..] |
|  | 7 | 3 | 1 |  |  |  |  |  |  |  |  |  | 0 | in[3:0][..] |
|  | 8 |  |  |  |  |  |  |  |  |  |  |  |  | 3 | in[8][..] |

It is important to note that for each of the empty entries on the table, the hardware may be fed with the maximum unsigned value. Further, an exemplary embodiment of the code for programming the control sequence used in the alpha trellis may be represented as:

---

Mode = 1 (C=⅔); Clock 2;

Alpha 0

CPU[0] Input A = alpha 0 + fw_modlogi 0
CPU[0] Input B = alpha 1 + fw_modlogi 1
CPU[1] Input A = alpha 2 + fw_modlogi 2
CPU[1] Input B = alpha 3 + fw_modlogi 3
(CPU[8] Input A = CPU[0]
CPU[8] Input B = CPU[1])

Alpha 1

CPU[2] Input A = alpha 0 + fw_modlogi 1
CPU[2] Input B = alpha 1 + fw_modlogi 0
CPU[3] Input A = alpha 2 + fw_modlogi 3
CPU[3] Input B = alpha 3 + fw_modlogi 2
(CPU[9] Input A = CPU[2]
CPU[9] Input B = CPU[3])

Alpha 2

CPU[4] Input A = alpha 0 + fw_modlogi 2
CPU[4] Input B = alpha 1 + fw_modlogi 3
CPU[5] Input A = alpha 2 + fw_modlogi 0
CPU[5] Input B = alpha 3 + fw_modlogi 1
(CPU[10] Input A = CPU[4]
CPU[10] Input B = CPU[5])

Alpha 3

CPU[6] Input A = alpha 0 + fw_modlogi 3
CPU[6] Input B = alpha 1 + fw_modlogi 2
CPU[7] Input A = alpha 2 + fw_modlogi 1
CPU[7] Input B = alpha 3 + fw_modlogi 0
(CPU[11] Input A = CPU[6]
CPU[11] Input B = CPU[7])
Alpha[7:0][..] = in[11:8][..] = CPU[11:8][..]

---

In contrast to the forward metric generated by the alpha trellis block 625, the reverse metric generated by the beta trellis block 630 starts on the right side of the trellis tree and proceeds with processing towards the left side. The reverse metric computation of the trellis tree for the beta trellis block 630 is:

$$\beta_n^k = \log(e^{\beta_{n+1}^1 + L_n^j}) \quad (17)$$

In equation 18, $L_n^j$ is the metric of branch j of the nth symbol. As described above, the metric for the symbol n that has binary value "00" is denoted as $L_n^0$. The metric of state k of the nth symbol is denoted as $\beta_n^k$. Referring again to FIG. 9, the reverse metric computation is evaluated using the following equations:

$$\beta_{12}^k = 0 \; \forall k=0,1 \ldots 3$$

$$\beta_{11}^0 = \log(e^{\beta_{12}^0 + L_{11}^0})$$

$$\beta_{11}^1 = \log(e^{\beta_{12}^0 + L_{11}^2})$$

$$\beta_{11}^2 = \log(e^{\beta_{12}^0 + L_{11}^1})$$

$$\beta_{11}^3 = \log(e^{\beta_{12}^0 + L_{11}^3})$$

$$\beta_{10}^0 = \log(e^{\beta_{11}^0 + L_{10}^0} + e^{\beta_{11}^1 + L_{10}^1})$$

$$\beta_{10}^1 = \log(e^{\beta_{11}^0 + L_{10}^1} + e^{\beta_{11}^1 + L_{10}^0})$$

$$\beta_{10}^2 = \log(e^{\beta_{11}^0 + L_{10}^2} + e^{\beta_{11}^1 + L_{10}^3})$$

$$\beta_{10}^3 = \log(e^{\beta_{11}^0 + L_{10}^3} + e^{\beta_{11}^1 + L_{10}^2})$$

$$\beta_{10}^4 = \log(e^{\beta_{11}^2 + L_{10}^2} + e^{\beta_{11}^3 + L_{10}^3})$$

$$\beta_{10}^5 = \log(e^{\beta_{11}^2 + L_{10}^3} + e^{\beta_{11}^3 + L_{10}^2})$$

$$\beta_{10}^6 = \log(e^{\beta_{11}^2 + L_{10}^0} + e^{\beta_{11}^3 + L_{10}^1})$$

$$\beta_{10}^7 = \log(e^{\beta_{11}^2 + L_{10}^1} + e^{\beta_{11}^3 + L_{10}^0})$$

$$\vdots$$

$$\beta_0^0 = \log(e^{\alpha_1^0 + L_1^0} + e^{\alpha_1^1 + L_1^1} + e^{\alpha_1^2 + L_1^2} + e^{\alpha_1^3 + L_1^3}) \quad (18)$$

In a preferred embodiment, the control sequence for the input_select block 1110, feedback_select block 1120, and output_mux 1140 used as part of the alpha trellis block 625 may be implemented as shown in Table 2:

TABLE 2

| Mode | Clock | beta_select[2:0] | beta_beta_select | | | | |
|---|---|---|---|---|---|---|---|
| | | | beta 0 | beta 1 | beta 2 | beta 3 | 4 |
| 1 (C = ⅔) | 1 | 0 | | | | | |
| | 2 | 1 | 0 1 | 0 1 | 0 1 | 0 1 | 2 3 |
| | 3 | 2 | 0 1 2 3 | 0 1 2 3 | 4 5 6 7 | 4 5 6 7 | |
| | 4 | 3 | 0 1 | 0 1 | 2 3 | 2 3 | |
| | 5 | 1 | 0 1 | 0 1 | 0 1 | 0 1 | 2 3 |
| | 6 | 2 | 0 1 2 3 | 0 1 2 3 | 4 5 6 7 | 4 5 6 7 | |
| | 7 | 3 | 0 1 | 0 1 | 2 3 | 2 3 | |
| | 8 | 1 | 0 1 | 0 1 | 0 1 | 0 1 | 2 3 |
| | 9 | 2 | 0 1 2 3 | 0 1 2 3 | 4 5 6 7 | 4 5 6 7 | |
| | 10 | 3 | 0 1 | 0 1 | 2 3 | 2 3 | |
| | 11 | 4 | 0 1 2 3 | 0 1 2 3 | 0 1 2 3 | 0 1 2 3 | |
| | 12 | 5 | 0 1 2 3 | | | | |
| 0 (C = ½) | 1 | | | | | | |
| | 2 | 3 | 0 1 | 0 1 | 2 3 | 2 3 | |
| | 3 | 3 | 0 1 | 0 1 | 2 3 | 2 3 | |
| | 4 | 3 | 0 1 | 0 1 | 2 3 | 2 3 | |
| | 5 | 3 | 0 1 | 0 1 | 2 3 | 2 3 | |
| | 6 | 3 | 0 1 | 0 1 | 2 3 | 2 3 | |
| | 7 | 3 | 0 1 | 0 1 | 2 3 | 2 3 | |
| | 8 | 5 | 0 1 2 3 | | | | |

| Mode | Clock | beta_beta_select | | | bw_select[2:0] | beta_bw_select | | |
|---|---|---|---|---|---|---|---|---|
| | | 5 | 6 | 7 | | beta 0 | beta 1 | beta 2 |
| 1 (C = ⅔) | 1 | | | | 0 | 0 | 2 | 1 |
| | 2 | 2 3 | 2 3 | 2 3 | 1 | 0 1 | 1 0 | 2 3 |
| | 3 | | | | 2 | 0 1 2 3 | 2 3 0 1 | 0 1 2 3 |
| | 4 | | | | 3 | 0 1 | 2 3 | 2 3 |
| | 5 | 2 3 | 2 3 | 2 3 | 1 | 0 1 | 1 0 | 2 3 |
| | 6 | | | | 2 | 0 1 2 3 | 2 3 0 1 | 0 1 2 3 |
| | 7 | | | | 4 | 0 1 | 2 3 | 0 1 |
| | 8 | 2 3 | 2 3 | 2 3 | 5 | 0 1 | 1 0 | 2 3 |
| | 9 | | | | 2 | 0 1 2 3 | 2 3 0 1 | 0 1 2 3 |
| | 10 | | | | 4 | 0 1 | 2 3 | 0 1 |
| | 11 | | | | 6 | 0 1 2 3 | 1 0 3 2 | 2 3 0 1 |
| | 12 | | | | 7 | 0 1 2 3 | | |
| 0 (C = ½) | 1 | | | | 8 | 0 | 2 | 1 |
| | 2 | | | | 3 | 0 1 | 2 3 | 2 3 |
| | 3 | | | | 3 | 0 1 | 2 3 | 2 3 |
| | 4 | | | | 3 | 0 1 | 2 3 | 2 3 |
| | 5 | | | | 4 | 0 1 | 2 3 | 0 1 |
| | 6 | | | | 4 | 0 1 | 2 3 | 0 1 |
| | 7 | | | | 4 | 0 1 | 2 3 | 0 1 |
| | 8 | | | | 7 | 0 1 2 3 | | |

| Mode | Clock | beta_bw_select | | | | | beta_mux_select[2:] | beta_mux beta[7:0][..] |
|---|---|---|---|---|---|---|---|---|
| | | beta 3 | 4 | 5 | 6 | 7 | | |
| 1 (C = ⅔) | 1 | 3 | | | | | 0 | in[3:0][..] |
| | 2 | 3 2 | 2 3 | 3 2 | 0 1 | 1 0 | 1 | in[7:0][..] |
| | 3 | 2 3 | 0 1 | | | | 2 | in[11:8][..] |
| | 4 | 0 1 | | | | | 0 | in[3:0][..] |
| | 5 | 3 2 | 2 3 | 3 2 | 0 1 | 1 0 | 1 | in[7:0][..] |
| | 6 | 2 3 | 0 1 | | | | 2 | in[11:8][..] |
| | 7 | 2 3 | | | | | 0 | in[3:0][..] |
| | 8 | 3 2 | 0 1 | 1 0 | 2 3 | 3 2 | 1 | in[7:0][..] |
| | 9 | 2 3 | 0 1 | | | | 2 | in[11:8][..] |
| | 10 | 2 3 | | | | | 0 | in[3:0][..] |
| | 11 | 3 2 | 1 0 | | | | 2 | in[11:8][..] |
| | 12 | | | | | | 3 | in[8][..] |
| 0 (C = ½) | 1 | 3 | | | | | 0 | in[3:0][..] |
| | 2 | 0 1 | | | | | 0 | in[3:0][..] |
| | 3 | 0 1 | | | | | 0 | in[3:0][..] |
| | 4 | 0 1 | | | | | 0 | in[3:0][..] |
| | 5 | 2 3 | | | | | 0 | in[3:0][..] |
| | 6 | 2 3 | | | | | 0 | in[3:0][..] |
| | 7 | 2 3 | | | | | 0 | in[3:0][..] |
| | 8 | | | | | | 3 | in[8][..] |

Figure 12A:
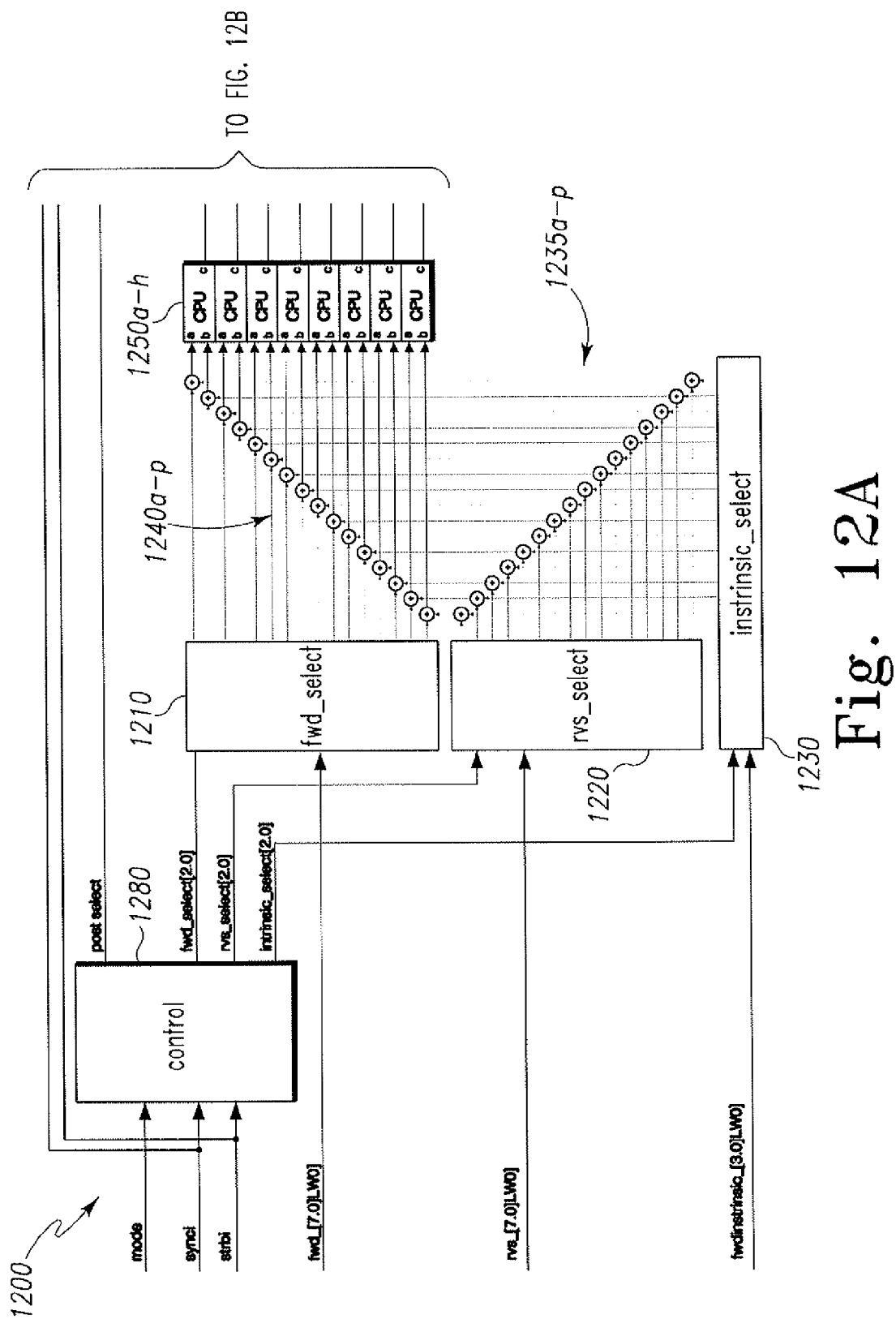
FIG. 12A and FIG. 12B are a block diagram of an embodiment of an a-posteriori computation block for a decoder of the present disclosure.
Figure 12B:
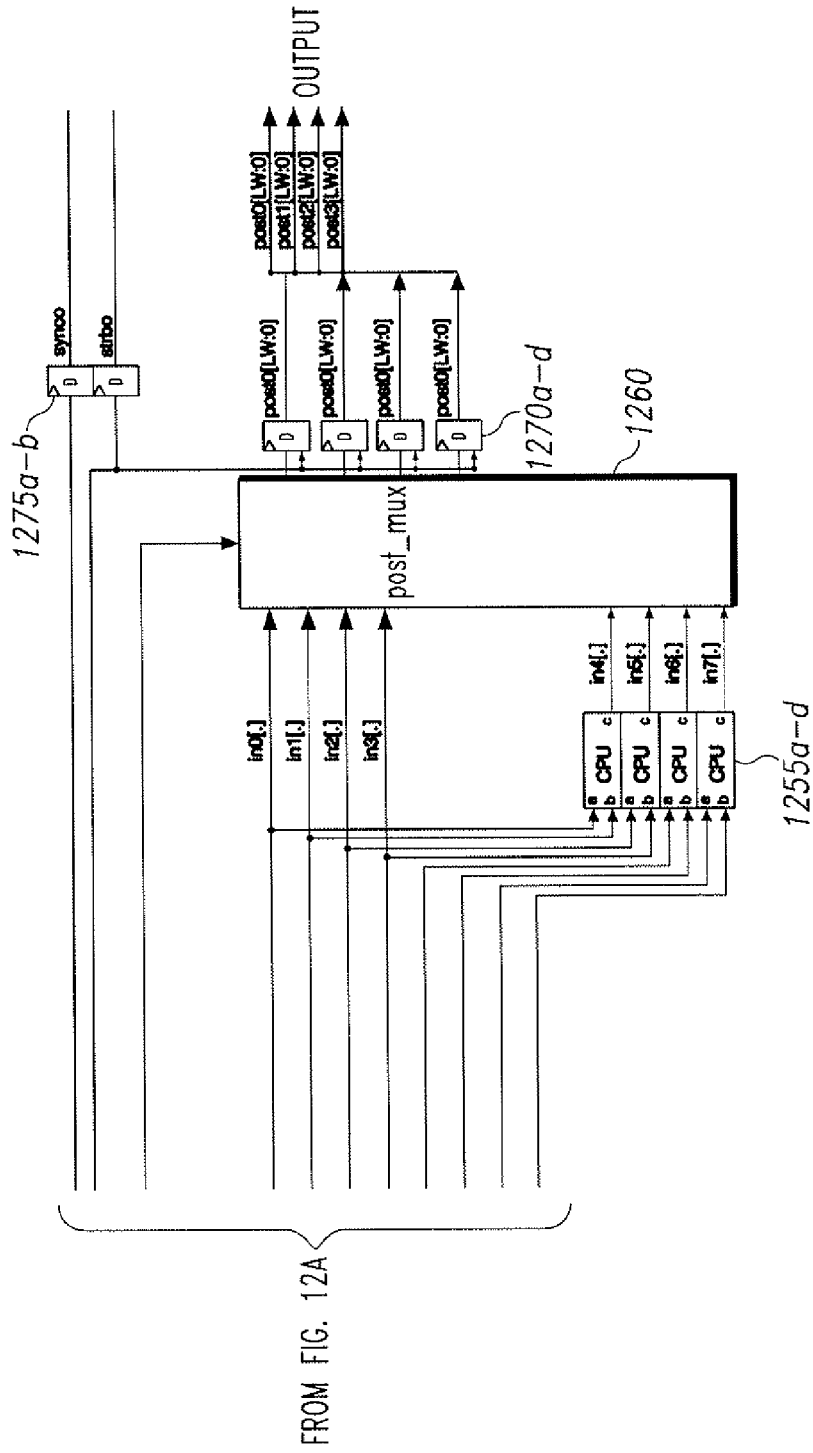

Turning now to FIG. 12A and FIG. 12B, a block diagram of an embodiment of an a-posteriori block 1200 used in a constituent byte-code decoder using aspects of the present disclosure is shown. In a-posteriori block 1200, the message signals representing the forward metric, the reverse metric and intrinsic metric connected to a fwd_select block 1210, rvs_select block 1220, and intrinsic_select block 1230. A series of adders 1235*a-p* and 1240*a-p* combine the selected portions (i.e. bits or symbols) of the forward metric message, the reverse metric message, and intrinsic message. The new metric computation is performed in the core process units 1250*a-h* and 1255*a-d*.

Each of the computed metrics from the core process units 1250*a-h* and 1255*a-d* is connected to a post_mux 1260. The outputs from the post_mux 1260 are buffered through D_buffers 1270*a-d*. The D_buffers 1270*a-d* provide the computed metric values as outputs for the a-posteriori block 1200.

The selection and multiplexing operations performed by fwd_select block 1210, rvs_select block 1220, intrinsic_select block 1230, and post_mux 1260 are controlled by the control block 1280. A-posteriori block 12100 also includes sync clock and strobe signals that are additionally connected through D-buffers 1275*a-b*, and a code rate mode input signal, for selecting the decoding code rate, that is provided to the control block 1170.

The a-posteriori block 1200 computes the a-posteriori metric using the following equations:

$$\gamma_0^0 = \log(e^{\alpha_0^0 + \beta_1^0 + L_0^0})$$

$$\gamma_0^1 = \log(e^{\alpha_0^0 + \beta_1^1 + L_0^1})$$

$$\gamma_0^2 = \log(e^{\alpha_0^0 + \beta_1^2 + L_0^2})$$

$$\gamma_0^3 = \log(e^{\alpha_0^0 + \beta_1^3 + L_0^3})$$

$$\vdots$$

$$\gamma_{11}^0 = \log(e^{\alpha_{11}^0 + \beta_{12}^0 + L_{11}^0})$$

$$\gamma_{11}^1 = \log(e^{\alpha_{11}^2 + \beta_{12}^0 + L_{11}^1})$$

$$\gamma_{11}^2 = \log(e^{\alpha_{11}^1 + \beta_{12}^0 + L_{11}^2})$$

$$\gamma_{11}^3 = \log(e^{\alpha_{11}^3 + \beta_{12}^0 + L_{11}^3}) \qquad (19)$$

In a preferred embodiment, the control sequence for the fwd_select block 1210, rvs_select block 1220, intrinsic_select block 1230, and post_mux 1260 used as part of the a-posteriori block 1200 may be implemented as shown in table 3

TABLE 3

| Mode | Clock | beta_select[2:0] | alpha_select post 0 | | | | post 1 | | | | post 2 | | | | post 3 | | | | bw_select[2:0] |
|---|---|---|---|---|---|---|---|---|---|---|---|---|---|---|---|---|---|---|---|
| 1 (C = 2/3) | 1 | 0 | 0 | | | | 0 | | | | 0 | | | | 0 | | | | 0 |
| | 2 | 1 | 0 | 1 | 2 | 3 | 1 | 0 | 3 | 2 | 2 | 3 | 0 | 1 | 3 | 2 | 1 | 0 | 1 |
| | 3 | 2 | 0 | 2 | | | 0 | 2 | | | 1 | 3 | | | 1 | 3 | | | 2 |
| | 4 | 3 | 0 | 1 | 2 | 3 | 0 | 1 | 2 | 3 | 1 | 0 | 3 | 2 | 1 | 0 | 3 | 2 | 3 |
| | 5 | 4 | 0 | 1 | 4 | 5 | 1 | 0 | 5 | 4 | 2 | 3 | 6 | 7 | 3 | 2 | 7 | 6 | 1 |
| | 6 | 2 | 0 | 2 | | | 0 | 2 | | | 1 | 3 | | | 1 | 3 | | | 2 |
| | 7 | 3 | 0 | 1 | 2 | 3 | 0 | 1 | 2 | 3 | 1 | 0 | 3 | 2 | 1 | 0 | 3 | 2 | 3 |
| | 8 | 5 | 0 | 1 | 6 | 7 | 1 | 0 | 7 | 6 | 2 | 3 | 4 | 5 | 3 | 2 | 5 | 4 | 1 |
| | 9 | 6 | 0 | 3 | | | 0 | 3 | | | 1 | 2 | | | 1 | 2 | | | 2 |
| | 10 | 3 | 0 | 1 | 2 | 3 | 0 | 1 | 2 | 3 | 1 | 0 | 3 | 2 | 1 | 0 | 3 | 2 | 3 |
| | 11 | 5 | 0 | 1 | 6 | 7 | 1 | 0 | 7 | 6 | 2 | 3 | 4 | 5 | 3 | 2 | 5 | 4 | 1 |
| | 12 | 7 | 0 | | | | 2 | | | | 1 | | | | 3 | | | | 4 |
| 0 (C = 1/2) | 1 | 0 | 0 | | | | 0 | | | | 0 | | | | 0 | | | | 0 |
| | 2 | 2 | 0 | 2 | | | 0 | 2 | | | 1 | 3 | | | 1 | 3 | | | 2 |
| | 3 | 2 | 0 | 2 | | | 0 | 2 | | | 1 | 3 | | | 1 | 3 | | | 2 |
| | 4 | 2 | 0 | 2 | | | 0 | 2 | | | 1 | 3 | | | 1 | 3 | | | 2 |
| | 5 | 6 | 0 | 3 | | | 0 | 3 | | | 1 | 2 | | | 1 | 2 | | | 2 |
| | 6 | 6 | 0 | 3 | | | 0 | 3 | | | 1 | 2 | | | 1 | 2 | | | 2 |
| | 7 | 6 | 0 | 3 | | | 0 | 3 | | | 1 | 2 | | | 1 | 2 | | | 2 |
| | 8 | 7 | 0 | | | | 2 | | | | 1 | | | | 3 | | | | 4 |

| Mode | Clock | beta_select post 0 | | | | post 1 | | | | post 2 | | | | post 3 | | | | bw_select[2:0] | intrinsic_select post 0 | | | |
|---|---|---|---|---|---|---|---|---|---|---|---|---|---|---|---|---|---|---|---|---|---|---|
| 1 (C = 2/3) | 1 | 0 | | | | 1 | | | | 2 | | | | 3 | | | | 0 | 0 | | | |
| | 2 | 0 | 1 | 2 | 3 | 0 | 1 | 2 | 3 | 0 | 1 | 2 | 3 | 0 | 1 | 2 | 3 | 1 | 0 | 0 | 0 | 0 |
| | 3 | 0 | 2 | | | 1 | 3 | | | 0 | 2 | | | 1 | 3 | | | 2 | 0 | 0 | | |
| | 4 | 0 | 2 | 4 | 6 | 1 | 3 | 5 | 7 | 0 | 2 | 4 | 6 | 1 | 3 | 5 | 7 | 1 | 0 | 0 | 0 | 0 |
| | 5 | 0 | 1 | 2 | 3 | 0 | 1 | 2 | 3 | 0 | 1 | 2 | 3 | 0 | 1 | 2 | 3 | 1 | 0 | 0 | 0 | 0 |
| | 6 | 0 | 2 | | | 1 | 3 | | | 0 | 2 | | | 1 | 3 | | | 2 | 0 | 0 | | |
| | 7 | 0 | 2 | 4 | 6 | 1 | 3 | 5 | 7 | 0 | 2 | 4 | 6 | 1 | 3 | 5 | 7 | 1 | 0 | 0 | 0 | 0 |
| | 8 | 0 | 1 | 2 | 3 | 0 | 1 | 2 | 3 | 0 | 1 | 2 | 3 | 0 | 1 | 2 | 3 | 1 | 0 | 0 | 0 | 0 |
| | 9 | 0 | 2 | | | 1 | 3 | | | 0 | 2 | | | 1 | 3 | | | 2 | 0 | 0 | | |
| | 10 | 0 | 2 | 4 | 6 | 1 | 3 | 5 | 7 | 0 | 2 | 4 | 6 | 1 | 3 | 5 | 7 | 1 | 0 | 0 | 0 | 0 |
| | 11 | 0 | 1 | 2 | 3 | 0 | 1 | 2 | 3 | 0 | 1 | 2 | 3 | 0 | 1 | 2 | 3 | 1 | 0 | 0 | 0 | 0 |
| | 12 | 0 | | | | 0 | | | | 0 | | | | 0 | | | | 3 | 0 | | | |
| 0 (C = 1/2) | 1 | 0 | | | | 1 | | | | 2 | | | | 3 | | | | 0 | 0 | | | |
| | 2 | 0 | 2 | | | 1 | 3 | | | 0 | 2 | | | 1 | 3 | | | 2 | 0 | 0 | | |
| | 3 | 0 | 2 | | | 1 | 3 | | | 0 | 2 | | | 1 | 3 | | | 2 | 0 | 0 | | |
| | 4 | 0 | 2 | | | 1 | 3 | | | 0 | 2 | | | 1 | 3 | | | 2 | 0 | 0 | | |
| | 5 | 0 | 2 | | | 1 | 3 | | | 0 | 2 | | | 1 | 3 | | | 2 | 0 | 0 | | |
| | 6 | 0 | 2 | | | 1 | 3 | | | 0 | 2 | | | 1 | 3 | | | 2 | 0 | 0 | | |
| | 7 | 0 | 2 | | | 1 | 3 | | | 0 | 2 | | | 1 | 3 | | | 2 | 0 | 0 | | |
| | 8 | 0 | | | | 0 | | | | 0 | | | | 0 | | | | 3 | 0 | | | |

TABLE 3-continued

| Mode | Clock | intrinsic_select | | | | | | | | | | | | pos_mux_select[2:] | post_mux post[3:0][ ] |
|---|---|---|---|---|---|---|---|---|---|---|---|---|---|---|---|
| | | post 1 | | | | post 2 | | | | post 3 | | | | | |
| 1 (C = ⅔) | 1  | 1 |   |   |   | 2 |   |   |   | 3 |   |   |   | 0 | in[3:0][..] |
|            | 2  | 1 | 1 | 1 | 1 | 2 | 2 | 2 | 2 | 3 | 3 | 3 | 3 | 1 | in[7:4][..] |
|            | 3  | 1 | 1 |   |   | 2 | 2 |   |   | 3 | 3 |   |   | 0 | in[3:0][..] |
|            | 4  | 1 | 1 | 1 | 1 | 2 | 2 | 2 | 2 | 3 | 3 | 3 | 3 | 1 | in[7:4][..] |
|            | 5  | 1 | 1 | 1 | 1 | 2 | 2 | 2 | 2 | 3 | 3 | 3 | 3 | 1 | in[7:4][..] |
|            | 6  | 1 | 1 |   |   | 2 | 2 |   |   | 3 | 3 |   |   | 0 | in[3:0][..] |
|            | 7  | 1 | 1 | 1 | 1 | 2 | 2 | 2 | 2 | 3 | 3 | 3 | 3 | 1 | in[7:4][..] |
|            | 8  | 1 | 1 | 1 | 1 | 2 | 2 | 2 | 2 | 3 | 3 | 3 | 3 | 1 | in[7:4][..] |
|            | 9  | 1 | 1 |   |   | 2 | 2 |   |   | 3 | 3 |   |   | 0 | in[3:0][..] |
|            | 10 | 1 | 1 | 1 | 1 | 2 | 2 | 2 | 2 | 3 | 3 | 3 | 3 | 1 | in[7:4][..] |
|            | 11 | 1 | 1 | 1 | 1 | 2 | 2 | 2 | 2 | 3 | 3 | 3 | 3 | 1 | in[7:4][..] |
|            | 12 | 1 |   |   |   | 2 |   |   |   | 3 |   |   |   | 0 | in[3:0][..] |
| 0 (C = ½)  | 1  | 1 |   |   |   | 2 |   |   |   | 3 |   |   |   | 0 | in[3:0][..] |
|            | 2  | 1 | 1 |   |   | 2 | 2 |   |   | 3 | 3 |   |   | 0 | in[3:0][..] |
|            | 3  | 1 | 1 |   |   | 2 | 2 |   |   | 3 | 3 |   |   | 0 | in[3:0][..] |
|            | 4  | 1 | 1 |   |   | 2 | 2 |   |   | 3 | 3 |   |   | 0 | in[3:0][..] |
|            | 5  | 1 | 1 |   |   | 2 | 2 |   |   | 3 | 3 |   |   | 0 | in[3:0][..] |
|            | 6  | 1 | 1 |   |   | 2 | 2 |   |   | 3 | 3 |   |   | 0 | in[3:0][..] |
|            | 7  | 1 | 1 |   |   | 2 | 2 |   |   | 3 | 3 |   |   | 0 | in[3:0][..] |
|            | 8  | 1 |   |   |   | 2 |   |   |   | 3 |   |   |   | 0 | in[3:0][..] |

Figure 13:
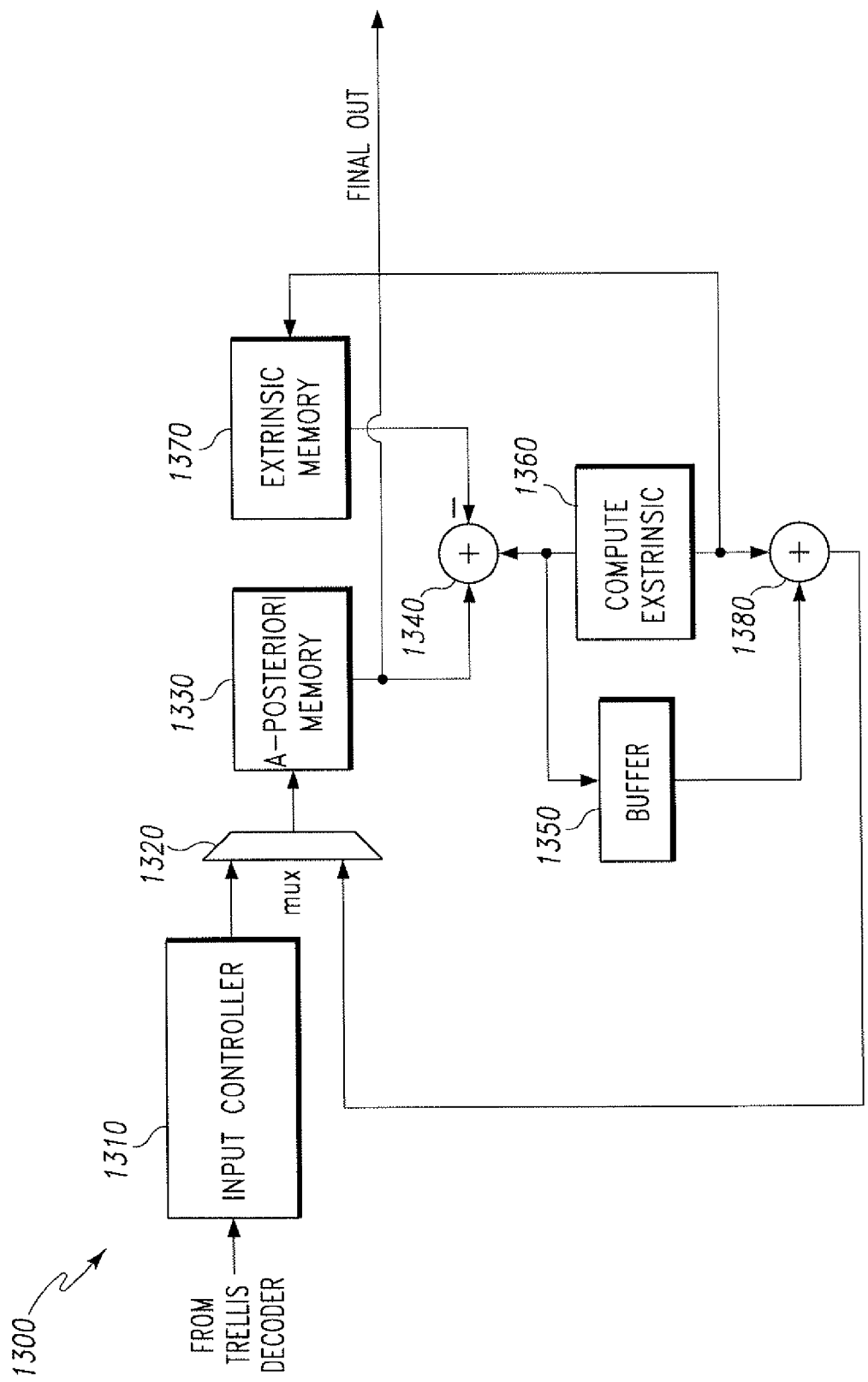
FIG. 13 is a block diagram of an embodiment of a byte-code decoder of the present disclosure.

Turning now to FIG. 13, a block diagram of an embodiment of a byte-code decoder 1300 using aspects of the present disclosure is shown. Byte-code decoder 1300 takes advantage of grouping and re-ordering of the incoming information in order to utilize an alternative decoding process based on the parity matrix relationship to the byte-code encoding process described earlier. An input coded message is provided to an input controller block 1310. The output of the input controller block is provided to one input of signal multiplexer 1320. The output of signal multiplexer 1320 is connected to the a-posteriori memory 1330. The output of the a-posteriori memory 1330 is connected to one input of the summer 1340. The output of the summer is connected to a delay buffer 1350 and to the extrinsic computation processor 1360. The output of the extrinsic computation processor 1360 is connected to extrinsic memory 1370. The output of the extrinsic memory 1370 is inverted and connected to the second input of summer 1340, the summer implementing a subtraction function. The outputs of extrinsic computation processor 1360 and the delay buffer 1350 are connected to a summer 1380. The output of the summer 1380 is provided to a second input of the input multiplexer 1320. The output of a-posteriori memory 1330 also provides an output of byte-code decoder 1300 following the iterative decoding process.

Input controller 1310 receives the incoming message and groups a portion of the incoming message into a subset of bits. The subset forms an input message and typically consists of probabilities, such as LLR values, for each of the bits in the subset. Input controller 1310 also controls, or gates, the delivery of the input message to the mux 1320 and also may control the input switching of mux 1320. The iterative operation of decoder 1300 is controlled by mux 1320. Mux 1320 outputs either the input message stream on the first iteration through the decoding process for initial decoding or outputs the newly computed feedback message supplied by summer 1380 for subsequent iterations through the decoding process.

The selected output from mux 1320 is provided to the a-posteriori memory 1330. The a-posteriori memory 1330 stores and arranges the information received from mux 1320. In a preferred embodiment, the a-posteriori memory 1330 re-orders the incoming subset of bits, received as bit reliabilities, during the first iteration of the decoding process. As described earlier, re-ordering may allow improvement in a decoding process that incorporates a parity check matrix. A-posteriori memory 1330 provides the re-ordered information message, as a subset of bits or bit reliabilities, to combiner 1340.

Combiner 1340 combines the re-ordered information message with the extrinsic information message provided by the extrinsic memory 1370. Extrinsic memory 1370 stores the extrinsic information values for the extrinsic information message computed in the extrinsic compute block 1360. In a preferred embodiment, combiner 1340 subtracts the extrinsic information message values from the re-ordered information message values outputs the combined information message values to the extrinsic compute block 1360.

The extrinsic compute block 1360 processes the combined information message from combiner 1340. The function of the extrinsic compute block 1360 will be further described below. The combined information message from combiner 1340 is also provided to a buffer 1350. Buffer 1350 is used to delay the combined information message in order to allow proper recombining in combiner 1380 with the output of the extrinsic computer block 1360. Combiner 1380 combines the delayed combined information message with the extrinsic information output from extrinsic computer block 1360. Combiner 1380 outputs a signal containing a-posteriori information message values and provides the signal to the mux 1320 for use as part of the iterative decoding process.

It is important to note that both the constituent decoding process and the concatenated decoding process may be described using one parity check matrix and processed using a single decoder, such as byte-code decoder 1300. In a concatenated decoding process, each constituent decoding process may be defined by its own parity check matrix. Both decoding processes, and therefore both parity matrices, are connected together via an interleaver and deinterleaver as shown in FIG. 4. The parity check matrices may be combined to form a single parity check matrix for both processes in the concatenated decoding process. The interleaving step defines the positions of nonzero elements in the combined parity check matrices.

The combining of parity check matrices for separately connected constituent decoders allows byte-code decoder 1300 to decode all possible byte-code code rate configurations. The LLR values for the portion of the incoming message are saved and, if necessary re-ordered, in the a-posteriori memory. The extrinsic information is subtracted from the a-posteriori reliabilities. The resulting intrinsic information is fed to buffer 1350 and to the extrinsic computer block 1360. The computed extrinsic information is saved back to the extrinsic memory 1370. Additionally, the computed extrinsic information is added to the previous intrinsic information and saved back to the a-posteriori memory 1330. The computation and process is repeated for each iterative decoding step. Iterative decoding continues until the a-posteriori reliability values for the information message exceed a reliability threshold or until the allotted decoding time expires.

Figure 14:
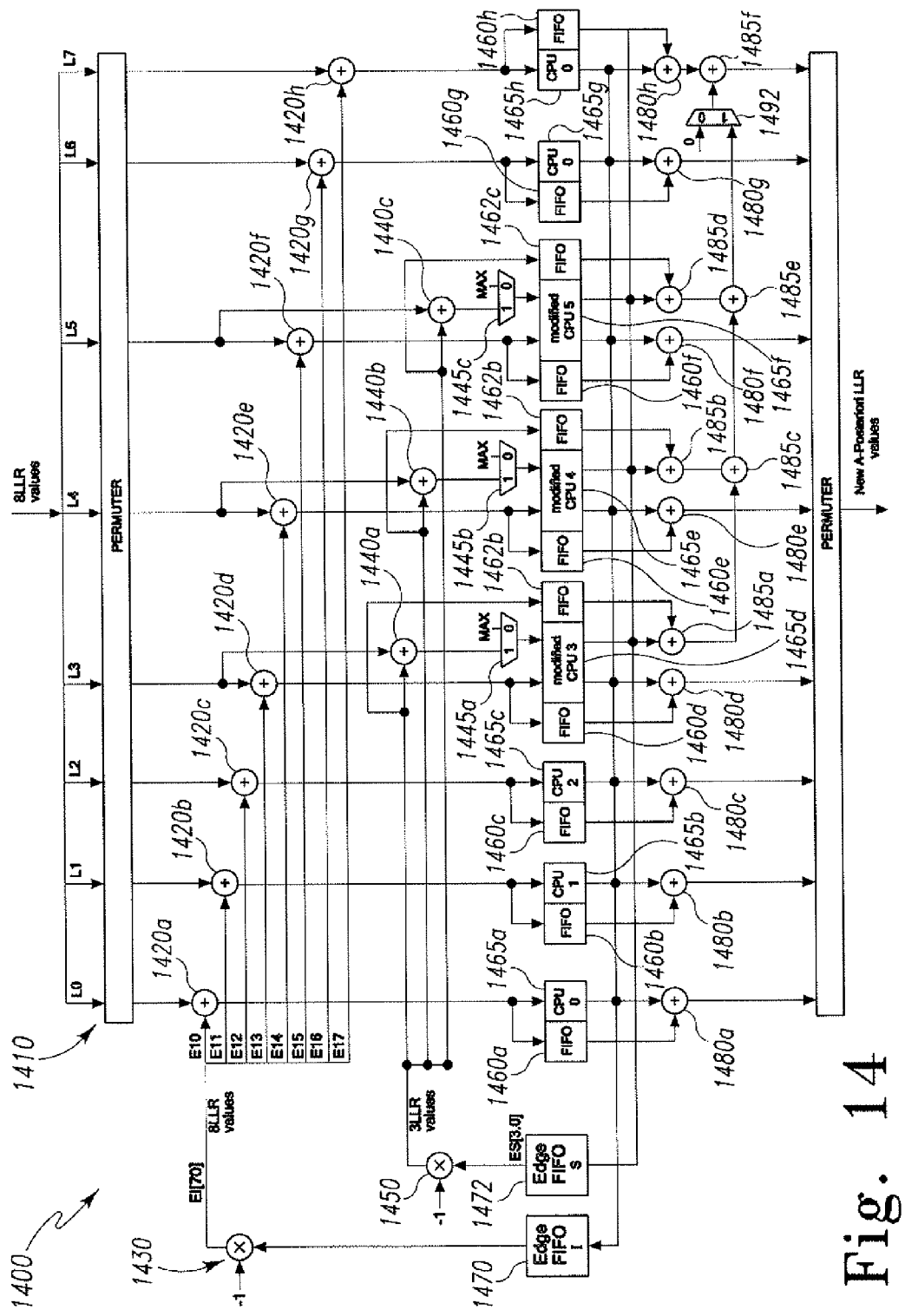
FIG. 14 is a block diagram of another embodiment of a byte-code decoder of the present disclosure.

Turning now to FIG. 14, a block diagram of another embodiment of a byte-code decoder 1400 using aspects of the present invention is shown. Byte-code decoder 1400 may be configured to implement a specific parity check decoding process known as low density parity check (LDPC) decoding.

An input message, as a sequence of 8 input LLR values representing the probabilities of bits from an information message, is provided to the input of permuter 1410. Permuter 1410 receives sequentially either a-priori (i.e. first iteration) or a-posteriori LLR values. Permuter 1410 is a simple shift register and allows a direct connection of the incoming LLR values to the adders 1420$a$-$h$ and 1440$a$-$c$. Permuter 1410 may also allow a cycling shift of the incoming values to the right by one location. Each of the 8 outputs from permuter 1410 connects to one input of adders 1420$a$-$h$. In addition, three outputs of permuter 1410, labeled L3, L4, and L4 are each provided to one input of a second set of adders 1440$a$-$c$.

Computed extrinsic information, passed through edge first in first out (FIFO) buffer 1470 and edge FIFO buffer 1472 and sign inverted through multipliers 1430 and 1450 is connected to the second input of adders 1420$a$-$h$ and 1440 $a$-$c$. The computed extrinsic information is subtracted from the incoming values. The resulting intrinsic information at the outputs of adders 1420$a$-$h$ is provides to the check process update units (CPUs) 1465$a$-$h$ and also to FIFO buffers 1460$a$-$h$. The operation of CPUs 1465$a$-$h$ will be described in further detail below. The computed extrinsic information from the CPUs 1465$a$-$h$, in addition to being provided back to adders 1420$a$-$h$ and 1440$a$-$c$, is combined with the buffered intrinsic information from FIFO buffers 1460$a$-$h$. The resulting new a-posteriori information, as LLR values for bits, is shifted back to its original position as necessary through permuter 1495 and the new a-posteriori LLR values are saved back to a memory, such as a-posteriori memory 1330 shown in FIG. 13.

CPUs 1465$d$, 1465$e$, and 1465$f$ are capable of computing two extrinsic information values. The second input to CPUs 1465$d$, 1465$e$, and 1465$f$ receive a second input from summers 1440$a$-$c$ through muxes 1445$a$-$c$. FIFO buffers 1462$a$-$c$ provide the previously computed extrinsic values to summers 1485$a$-$e$ for combining one set of the newly computed extrinsic values from CPUs 1465$d$, 1465$e$, and 1465$f$.

The decoding process used by byte-code decoder 1400 may be regarded as a binary LDPC decoding process. Each parity check equation in is interpreted as a low-density parity check code. Byte-code decoder 1400 has a processing parallelism of 8. As a result, byte-code decoder 1400 is capable of processing one equation set of 8 equations at one time.

CPUs 1465$a$-$h$ compute the extrinsic information using a bit based LDPC algorithm. In a preferred embodiment, the equation for the LDPC algorithm may be represented as:

$$R_{m,n} = 2\tanh^{-1}\left(\prod_{i \in C(m)\backslash n} \tanh(Q_{m,i}/2)\right) \stackrel{def}{=} L\left(\sum_{i \in C(m)\backslash n} \oplus Q_{m,i}\right). \quad (20)$$

In the above equation, $Q_{m,i_j}$ denotes the computed intrinsic value of parity check equation m and bit $i_j$ as an input to CPUs 1465$a$-$h$. $R_{m,i}$ denotes the new extrinsic values computed by the CPUs 1465$a$-$h$. C(m)={n: $H_{m,n}$=1} represents the set of input values that are connected to check equation. The LDPC decoding process computes extrinsic values based on both the identity matrix I and the generator matrix S from equation 6. During decoding of the Identity matrix, the second input of modified CPU unit is not used, the input is simply disabled by feeding the maximum positive LLR value through muxes 1445$a$-$c$. During decoding of the S matrix, the intrinsic information is computed and fed to second input.

The first column of the S matrix has multiple locations having a value of one. The corresponding a-posteriori value of that column is the sum of all extrinsic information of each equation of that column. The summation is achieved using summer 1485$f$ and mux 1492. In order to compute the new a-posteriori value for CPU 1465$h$ and summer 1480$h$, the extrinsic values are computed at CPUs 1465$d$, 1465$e$, and 1465$f$ and the a-posteriori value from summer 1480$h$ is combined at the output of summer 1485.

Byte-code decoder 1300, described above, may also allow other groupings of bits. For instance, in addition to the grouping to form a subset of 8 or more bits used in a binary LDPC decoding process, a second grouping may be formed by further grouping the bits within the subset to form symbols known as LDPC symbols. The additional grouping provides a further improvement in the decoding process by reducing the decoding time when using a LDPC decoding process.

The decoding algorithm computing extrinsic and a-posteriori probability values using LDPC symbols in place of bits is commonly referred to as a nonbinary LDPC code and may be defined using the properties of a Galois Field space. In a preferred embodiment, a primitive polynomial may be defined over GF(8) as:

$$p(x) = 1 + x + x^3 \quad (21)$$

The received coded message may be represented as a symbol containing 3 message bits including systematic and non-systematic bit information.

As a result, each received symbol may be represented as 8 probabilities:

$$P(x_{symbol}\text{="000"}), P(x_{symbol}\text{="001"}), P(x_{symbol}\text{="010"}),$$
$$P(x_{symbol}\text{="011"}), P(x_{symbol}\text{="100"}),$$
$$P(x_{symbol}\text{="101"}), P(x_{symbol}\text{="110"}),$$
$$P(x_{symbol}\text{="111"})$$

In order to decode the LDPC symbol, the parity check equation may be used:

$$cH^T = 3c_2 + 2c_1 + c_0 = 0, c_i \in GF(8) \quad (22)$$

In the equation 22, each symbol $c_i$ represents 8 different bit constellations or probabilities. The complete equation will contain 512 (i.e. 8·8·8) different possible bit constellations. The new constellation probabilities are calculated by convolving the constellation probabilities with the incoming information. For example, the bit constellation probable for $c_0 = 0$ may be expressed as:

$$r_{0,0}^0 = \sum_{x':x_0'=0} Prob[z_0 | x'] \prod_{j \in N(0) \setminus 0} q_{0,j}^{x_j'} \quad (23)$$

$$= q_{0,2}^0 q_{0,1}^0 + q_{0,2}^1 q_1^4 + q_{0,2}^2 q_{0,1}^3 + q_{0,2}^3 q_{0,1}^7 +$$

$$q_{0,2}^5 q_{0,1}^6 + q_{0,2}^5 q_{0,1}^2 + q_{0,2}^6 q_{0,1}^5 + q_{0,2}^7 q_{0,1}^1$$

In equation 23, values $q_j^x$ represent the present probabilities for each of the possible constellation values and $r''_m$ represent the newly computed probabilities for each of the possible constellation values. For each $r_{00}^i$ we have $2^p=8$ different possibilities.

$$r_{00,0}^1 = \sum_{x':x_0'=1} Prob[z_0 | x'] \prod_{j \in N(0) \setminus 0} q_{0,j}^{x_j'} \quad (24)$$

$$= q_{0,2}^0 q_{0,1}^5 + q_{0,2}^1 q_{0,1}^1 + q_{0,2}^2 q_{0,1}^6 + q_{0,2}^3 q_{0,1}^2 +$$

$$q_{0,2}^4 q_{0,1}^3 + q_{0,2}^5 q_{0,1}^7 + q_{0,2}^6 q_{0,1}^0 + q_{0,2}^7 q_{0,1}^4$$

$$r_{0,0}^2 = q_{0,2}^0 q_{0,1}^1 + q_{0,2}^1 q_{0,1}^5 + q_{0,2}^2 q_{0,1}^2 + \quad (25)$$

$$q_{0,2}^3 q_{0,1}^6 + q_{0,2}^4 q_{0,1}^7 + q_{0,2}^5 q_{0,1}^3 + q_{0,2}^6 q_{0,1}^4 + q_{0,2}^7 q_{0,1}^0$$

$$r_{0,0}^3 = q_{0,2}^0 q_{0,1}^4 + q_{0,2}^1 q_{0,1}^0 + q_{0,2}^2 q_{0,1}^1 + q_{0,2}^3 q_{0,1}^3 +$$

$$q_{0,2}^4 q_{0,1}^2 + q_{0,2}^5 q_{0,1}^6 + q_{0,2}^6 q_{0,1}^1 + q_{0,2}^7 q_{0,1}^5$$

$$r_{0,0}^4 = q_{0,2}^0 q_{0,1}^2 + q_{0,2}^1 q_{0,1}^6 + q_{0,2}^2 q_{0,1}^4 + q_{0,2}^3 q_{0,1}^5 +$$

$$q_{0,2}^4 q_{0,1}^4 + q_{0,2}^5 q_{0,1}^0 + q_{0,2}^6 q_{0,1}^7 + q_{0,2}^7 q_{0,1}^3$$

$$r_{0,0}^5 = q_{0,2}^0 q_{0,1}^7 + q_{0,2}^1 q_{0,1}^3 + q_{0,2}^2 q_{0,1}^4 + q_{0,2}^3 q_{0,1}^0 +$$

$$q_{0,2}^4 q_{0,1}^1 + q_{0,2}^5 q_{0,1}^5 + q_{0,2}^6 q_{0,1}^2 + q_{0,2}^7 q_{0,1}^6$$

$$r_{0,0}^6 = q_{0,2}^0 q_{0,1}^3 + q_{0,2}^1 q_{0,1}^7 + q_{0,2}^2 q_{0,1}^0 + q_{0,2}^3 q_{0,1}^4 +$$

$$q_{0,2}^4 q_{0,1}^5 + q_{0,2}^5 q_{0,1}^1 + q_{0,2}^6 q_{0,1}^6 + q_{0,2}^7 q_{0,1}^2$$

$$r_{0,0}^7 = q_{0,2}^0 q_{0,1}^6 + q_{0,2}^1 q_{0,1}^2 + q_{0,2}^2 q_{0,1}^5 + q_{0,2}^3 q_{0,1}^1 +$$

$$q_{0,2}^4 q_{0,1}^0 + q_{0,2}^5 q_{0,1}^4 + q_{0,2}^6 q_{0,1}^3 + q_{0,2}^7 q_{0,1}^7$$

Figure 15:
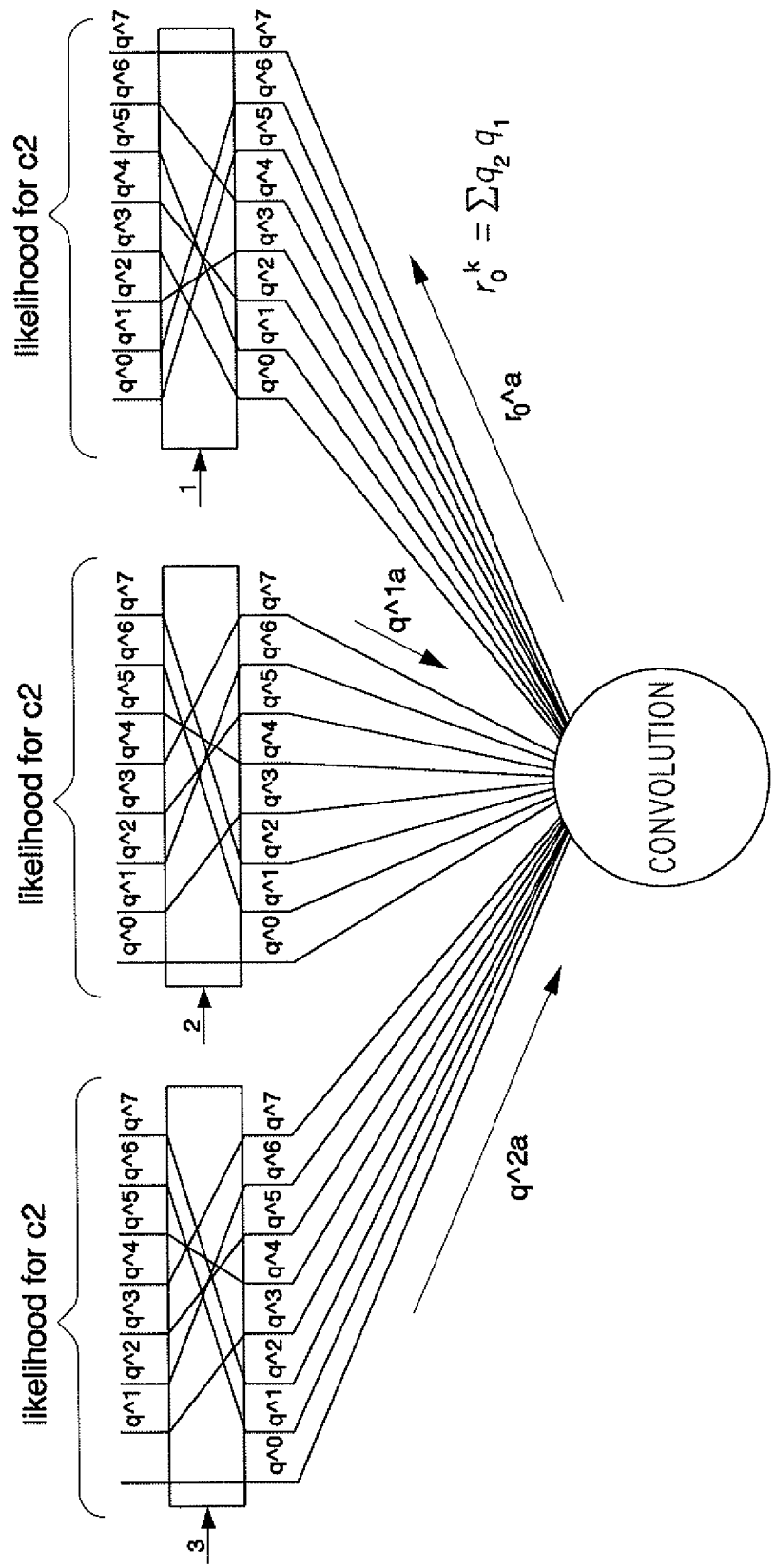
FIG. 15 is a diagram illustrating embodiment of a tanner graph for a decoder of the present disclosure.
Figure 16:
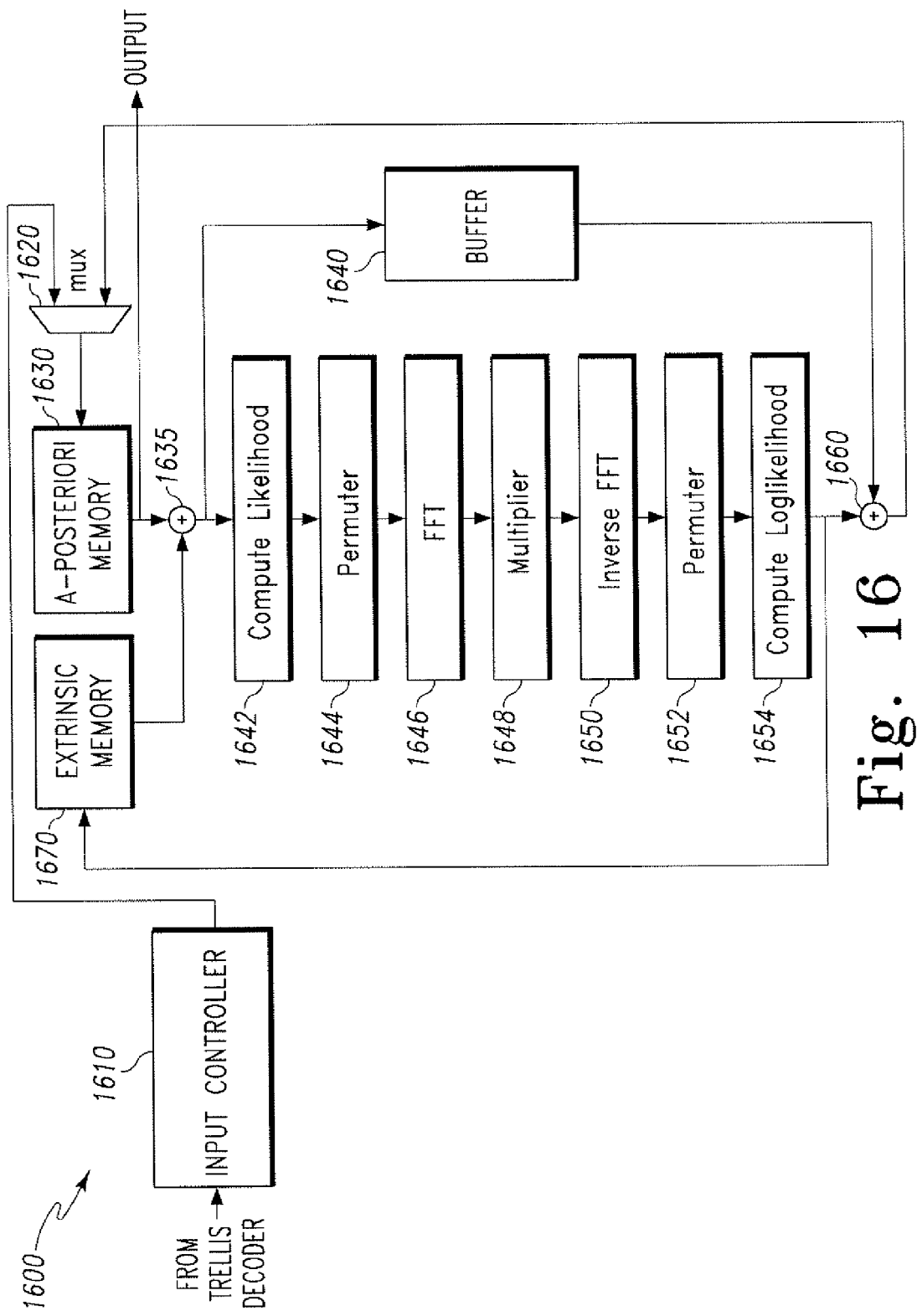
FIG. 16 is a block diagram of a further embodiment of a byte-code decoder of the present disclosure.

FIG. 15 illustrates a graphical representation of equation 25 as a Tanner Graph. Tanner Graphs are often used to graphically display the complex mathematical interactions involved in nonbinary LDPC decoding. FIG. 15 illustrates the initial processing for each of the $q_j^x$ values, including any rearrangement of values, through a vector convolution function and the resultant output $r''_m$ values following the vector convolution.

The implementation of a convolution function, and in particular a complex vector convolution function, requires a large number computations. A simplification is possible by applying a transform function to the $r''_m$ values and $q_j^x$ values, represented as vectors. Applying a transform function allows for a simpler vector multiplication of the transformed $r''_m$ values and $q_j^x$ values. Following the vector multiplication, an inverse transform function is applied to the resultant output vector. In a preferred embodiment, a Fourier transform function may be used and may be further implemented in hardware as the simpler fast Fourier transform (FFT). The FFT often employs an efficient butterfly computation technique that enables the transformation and inverse transformation to be computed using addition steps instead of multiplication steps. It is important to note that other transform functions may be used including, but not limited to, the Hadamard transform and the Discrete Cosine transform.

Turning now to FIG. 15, a block diagram of a further embodiment of a byte-code decoder 1500 using aspects of the present invention is shown. Byte-code decoder 1500 utilizes the property associated with the grouping and re-ordering of a portion of the incoming information message and the parity check matrix associated with the byte-code encoding process in a manner similar to that described for decoder 1300 in FIG. 13 and decoder 1400 in FIG. 14.

In byte-code decoder 1600, an input message is provided to an input controller block 1610. The output of the input controller block is provided to one input of signal multiplexer 1620. The output of signal multiplexer 1620 is connected to the a-posteriori memory 1630. The output of the a-posteriori memory 1630 is connected to one input of the summer 1635. The output of the summer is connected to a delay buffer 1640 and to the likelihood computation processor 1642. The output of the likelihood computation processor 1642 is connected to, in a serial fashion, permuter 1644, fast fourier transform processor (FFT) 1646, multiplier 1648, inverse FFT 1650, permuter 1652, and loglikehood computation processor 1654. The output of the loglikelihood computation processor 1654 is connected to the extrinsic memory 1670 and to one input of summer 1660. The output of extrinsic memory 1670 is connected back to the second input of summer 1635. The output of the buffer 1640 is connected to the second input of summer 1660. The output of the summer 1660 is provided to a second input of the input multiplexer 1620. The output of a-posteriori memory 1630 also serves as the output of byte-code decoder 1600 following the iterative decoding process. It is important to that input controller and inserter 1610, mux 1610, a-posteriori memory 1630, extrinsic memory 1670, summer 1635, buffer 1640, and summer 1660 are similarly connected and functionally identical as those same blocks described for byte-code decoder 1300 and will not be further described here except as necessary.

The likelihood computation processor 1642 receives the intrinsic information message from summer 1635 and converts the LLR values for the bits in the intrinsic information to linear or likelihood probabilities. The likelihood computation processor 1642 may also re-compute likelihood values for the LDPC symbols based on the additional bit to symbol grouping for the non-binary LDPC decoding process. Permuter 1644 receives the likelihood values for the LDPC symbols from likelihood computation processor and provides any reordering or rearranging of the LDPC symbols that is necessary for the non-binary LDPC decoding process. Permuter 1644 also controls which set of LDPC symbols is provided to the FFT 1646.

FFT 1646, multiplier 1648, and inverse FFT 1650 perform the convolution function described above in conjunction with the non-binary LDPC algorithm. The FFT 1646 converts the incoming time domain based LDPC symbols into equivalent frequency domain symbols. The frequency domain LDPC symbols are vector multiplied in multiplier 1648. The newly computed frequency domain LDPC symbols are transformed back into time domain LDPC symbols in inverse FFT 1650. The newly computed time domain LDPC symbols are provided to permuter 1652. Permuter 1652 reverses any reordering and rearranging carried out by Permuter 1644.

Loglikelihood computation processor 1654 converts the linear likelihood probability values associated with the LDPC symbols to LLR values. Loglikelihood computation processor 1654 may also re-compute the LLR values for the bits within the LDPC symbols. Conversion to LLR values for bits rather than LDPC symbols may be necessary in order to allow the new LLR values to be provided to either previous or subsequent blocks in the decoder, such as trellis decoder 320 and Reed-Solomon decoder 380 in FIG. 3.

Figure 17:
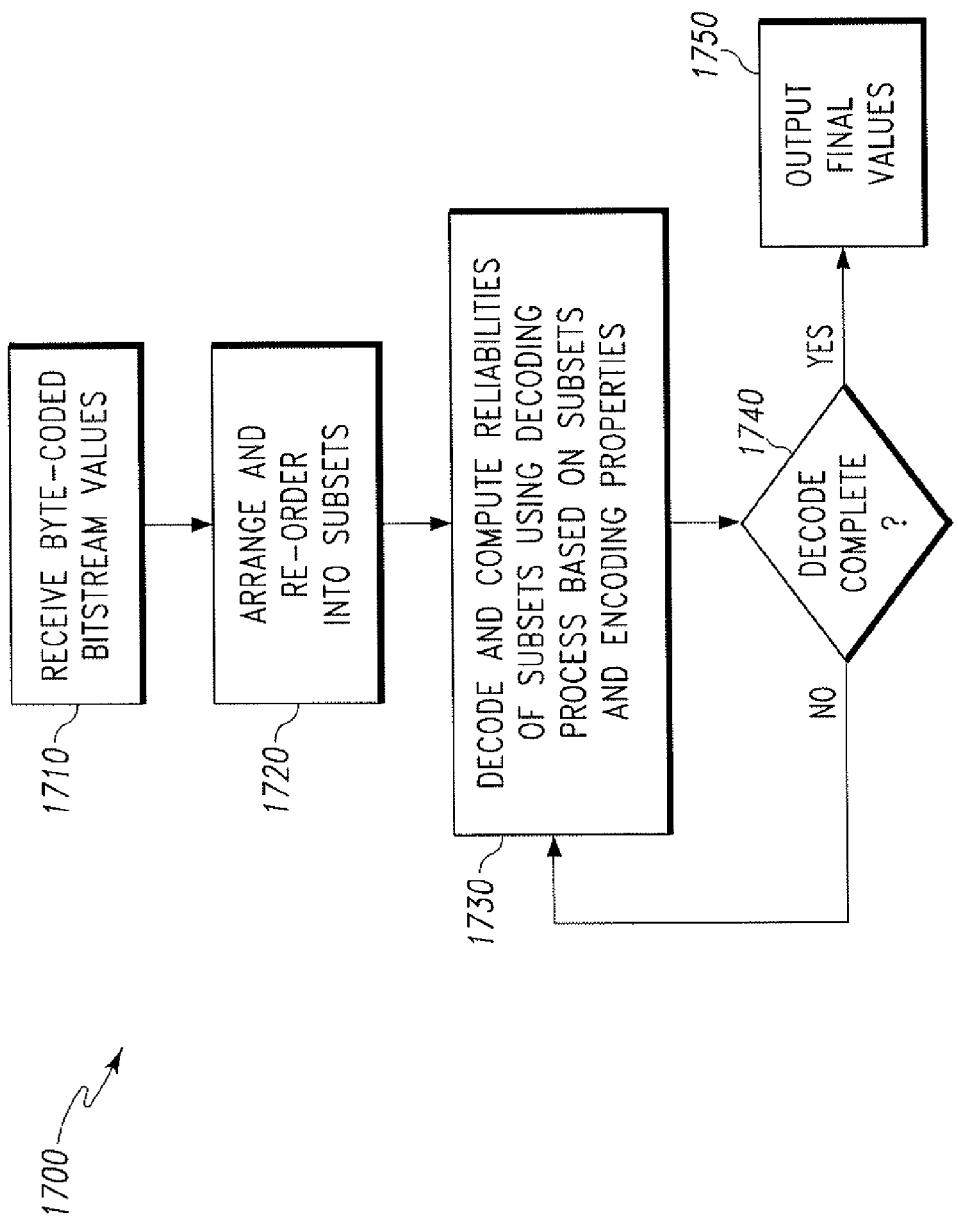
FIG. 17 is a flow chart of an embodiment of a decoding process of the present disclosure.

Turning now to FIG. 17, a flow chart for an embodiment of a process 1700 for decoding a byte-code encoded signal using aspects of the present invention is shown. Process 1700 will primarily be described in conjunction with the constituent byte-code decoder 1300. However, it should be noted that process 1700 may be applied to other byte-code decoders, such as constituent byte-code decoder 600, and may further be used as part of a larger process incorporate multiple decoders, such as decoder 300.

Process 1700 begins at step 1710 with receiving a byte-code encoded message as a bitstream containing packets or bytes of systematic and non-systematic byte-code encoded data. The received message bitstream is byte-code encoded during the encoding and transmission of the signal using a linear block encoding process, such as the process described for GF(256) SCBC 114 in FIG. 1. The message bitstream may include bit values for each bit in the message or, preferably, may include probabilities or reliabilities for bit values or probabilities for values of groups of bits such as symbols.

Next, at step 1720, the incoming message is arranged into subsets. The arrangement of bits in the incoming message into subsets may be determined primarily based on the decoding process used. As noted earlier, byte-code decoding typically involves a bit serial evaluation process. The decoding process may be improved by iterative evaluation. It is possible to further improve the decoding of a byte-code encoding signal by utilizing properties associated with the byte-code encoding process based further on the properties of Galois Fields. In a preferred embodiment, the incoming message is arranged into subsets of 8 bits for processing as part of a parity check matrix using an LDPC parity check process. It is important to note that the arrangement may further include a re-ordering or rearranging of the bits in the subset as necessary for the parity check process.

Next, at step 1730, the subsets are decoded using the decoding process that has been chosen based on the properties of the subset selected and the properties of the byte-code encoding process. In a preferred embodiment, an LDPC parity check decoding process is chosen based on a primitive polynomial and the generation of a parity matrix in GF(2). The LDPC parity check decoding process in GF(2) is used rather than decoding the incoming message in the GF(256) space using an inverse to the generator matrix values in order to improve the decoding efficiency. The decoding step 1730 may also include computing a set of reliabilities for the current state of the message bits in the subset. Probabilities are also determined for the coded redundant bits in the message and made available for use as a feedback signal in either a previous decoding process, such as another parity check process used in decoding step 1730 or a previous trellis decoding process.

Next, at step 1740, a determination is made as to whether the decoding process has correctly determined and decoded the message. The determination includes comparing the computed probabilities against a set of predetermined thresholds. If the decoding process at step 1740 is not complete, then the process returns to step 1730 for another decoding step. If the decoding process at step 1740 is complete, then at step 1750, the final values are output from the decoding process. In a preferred embodiment, the final values are provided as an output of the constituent byte-code decoder 1300. The final value may be output as hard decision, or bit, values, or as soft decision probability values. The outputs may be provided to a further decoder such as another byte-code decoder, or to a Reed-Solomon decoder. The outputs may also be provided back to the previous decoding stage such as a trellis decoder for a further trellis decoding improvement. Step 1750 may also include a re-ordering or rearranging of bits in the subset in order to restore the proper order of the bits in the output message. It is important to note that the process between step 1730 and 1740 may iterate until the decoding is complete or until a specific allotted time for the completion of the decoding step is exceeded.

Figure 18:
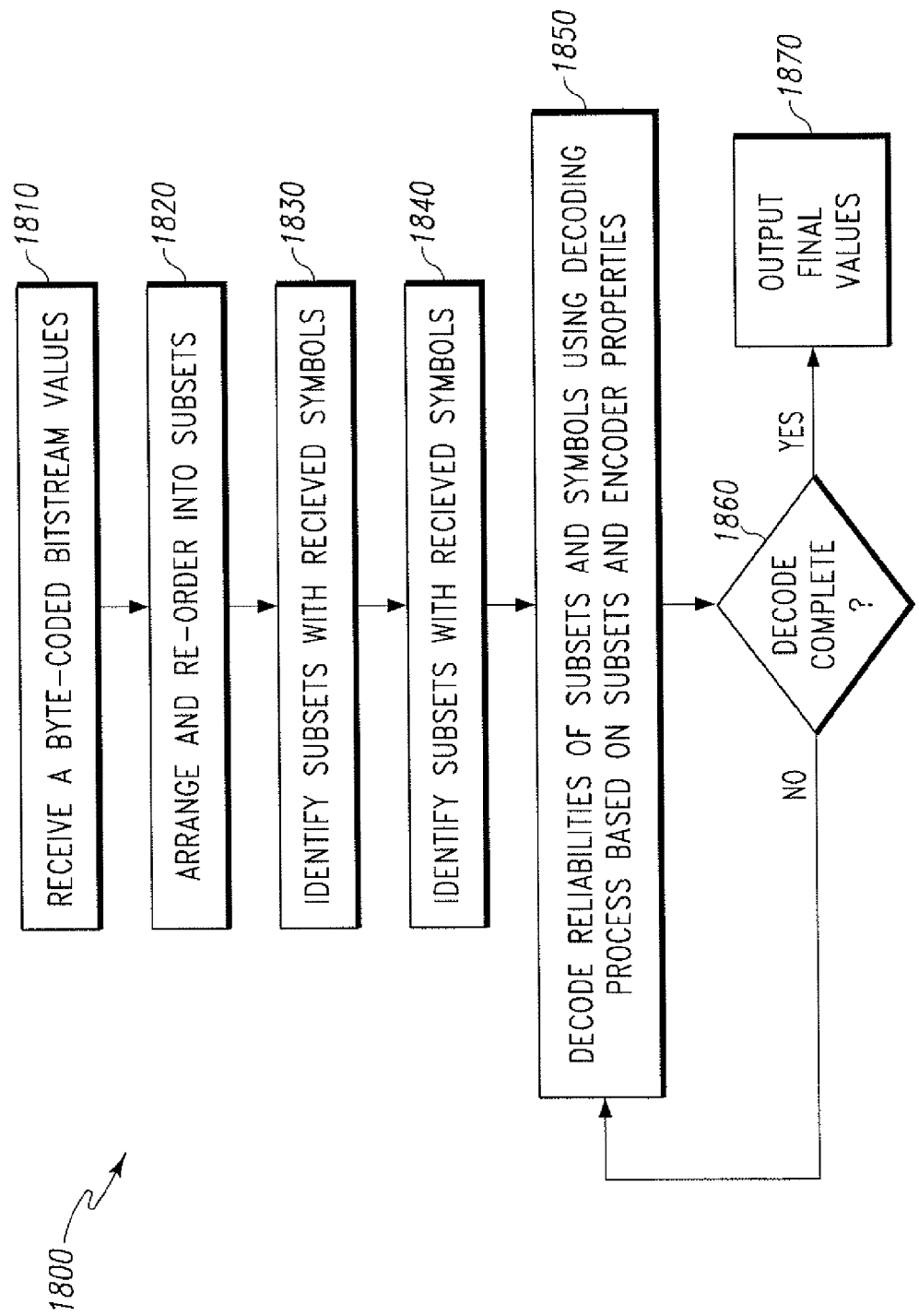
FIG. 18 is a flow chart of another embodiment of a decoding process of the present disclosure.

Turning now to FIG. 18, a flow chart of another embodiment of a process 1800 for decoding a byte-code encoded signal using aspects of the present invention is shown. Process 1800 will primarily be described in conjunction with the constituent byte-code decoder 600 in FIG. 6. However, it should be noted that process 1800 may be applied to other byte-code decoders and may further be used as part of a larger process that incorporates multiple decoders, such as decoder 300 in FIG. 3.

Process 1800 begins at step 1810 by receiving an encoded message as a bitstream contain systematic and non-systematic information. The message bitstream may include bit values for each bit in the message or, preferably, may include probabilities or reliabilities for bit values or probabilities for values of groups of bits such as symbols. The message may also include information about the received trellis modulated symbols and the relationship between the symbols and the bits in the bitstream.

Next, at step 1820, the incoming message stream is arranged into subsets. As noted earlier, decoding of block encoded messages, such as byte-code encoded messages, typically involves a bit serial evaluation process. The decoding process may often be improved through iterative evaluation. It is possible to further improve the decoding of a byte-code encoding signal by utilizing properties associated with the encoding process. In a preferred embodiment, the incoming message is arranged into subsets of 16 bits and decoded using an iterative trellis tree based algorithm, such as the BCJR algorithm.

Next, at step 1830, a further grouping of subsets of bits based on the identified symbol relationship is performed. The grouping of the bits based on inherent transmitted symbol relationships provides additional intrinsic information that may be used to further improve the decoding process. At step 1840, the symbols and the underlying bits are re-ordered in order to optimize the trellis decoding process. Potential symbol re-ordering is illustrated in FIGS. 9 and 10 described earlier.

Next, at step 1850, the symbols in the subsets are decoded using a symbol based trellis decoding algorithm, such as the BCJR algorithm described earlier, and further utilizing one or more parity equation of a set of parity equations chosen based on the properties of the subset selected and the properties of the encoding process. In a preferred embodiment, a set of parity check equations are generated using a parity matrix in GF(2). As described earlier it may also be possible to use a smaller, and possibly changing, subset of bits and a single parity equation at a time during decoding. The decoding step 1850 may also include computing a set of reliabilities for the message bits in the subset. Probabilities are also determined for the coded redundant bits in the message and made available for use as a feedback signal in either a previous decoding process.

Next, at step 1860, a determination is made as to whether the decoding process has correctly determined and decoded the message. The determination includes comparing the computed probabilities against a set of predetermined thresholds. If the decoding process at step 1860 is not complete, then the process returns to step 1850 for another decoding step. If the decoding process at step 1860 is complete, then at step 1870, the final values are output from the decoding process. In a preferred embodiment, the final values are provided as an output of the constituent byte-code decoder 600. The final values may be output as hard decision, or bit values, or as soft decision probability values. The outputs may be provided to a further decoder, such as another byte-code decoder or a Reed-Solomon decoder. The outputs may also be provided back to the previous decoding stage, such as trellis decoder 320 in FIG. 3, allowing a further improvement in the decoding process. Step 1870 may also include a re-ordering or rearranging of bits in the subset in order to restore the proper order of the bits in the output message. It is important to note that the process between step 1850 and 1860 may iterate until the decoding process is complete or may be truncated based on a specific allotted decoding completion time.

Although process 1800 has been primarily described in conjunction with a symbol based trellis decoding process, process 1800 may also be used to implement a bit based trellis decoding process. Implementation of process 1800 using a bit based trellis decoding process may, for instance, omit step 1830 related to identifying the symbol to bit relationships.

The present disclosure describes a specific serial concatenated block code having constituent code rates of either code rate 1/2 or code rate 2/3. The disclosure takes advantage of the special property of the constituent code structure that the code may be decoded using groupings of incoming bits that may be non-contiguous in order to improve the decoder efficiency and performance. The disclosure describes several possible approaches to bit groupings including a binary LDPC process, a non-binary LDPC process, a bit trellis mapping process, and a modulation symbol trellis mapping process.

While the embodiments may be susceptible to various modifications and alternative forms, specific embodiments have been shown by way of example in the drawings and have been described in detail herein. However, it should be understood that the disclosure is not intended to be limited to the particular forms disclosed. Rather, the disclosure is to cover all modifications, equivalents and alternatives falling within the spirit and scope of the disclosure as defined by the following appended claims.

What is claimed is:

1. A method of decoding a bitstream, comprising:
   receiving a demodulated bitstream, the demodulated bitstream encoded using a byte-code encoding process;
   arranging the demodulated bitstream into a plurality of subsets, each subset containing a plurality of bits;
   identifying a set of symbols in each of the subsets, each symbol including at least two bits in the subset, the set of symbols related to a modulation format for the demodulated bitstream;
   reordering the set of symbols in each subset of the plurality of subsets; and
   decoding each reordered subset based on a trellis relationship between the set of symbols in the reordered subset and a parity checking relationship between the bits in the reordered subset.

2. The method of claim 1, wherein the parity checking relationship is a set of parity check relationships.

3. The method of claim 2, wherein the set of parity check relationships are parity equations.

4. The method of claim 1, wherein the decoding includes a convolutional decoding process.

5. The method of claim 1, wherein the byte-code encoding process is based on a short linear block code in the Galois Field 256 space.

6. An apparatus for decoding a bitstream, comprising:
   means for receiving a demodulated bitstream, the demodulated bitstream encoded using a byte-code encoding process;
   means for arranging the demodulated bitstream into a plurality of subsets, each subset containing a plurality of bits;
   means for identifying a set of symbols in each of the subsets, each symbol including at least two bits in the subset, the set of symbols related to a modulation format for the demodulated bitstream;
   means for reordering the set of symbols in each subset of the plurality of subsets; and
   means for decoding each reordered subset based on a trellis relationship between the set of symbols in the reordered subset and a parity checking relationship between the bits in the reordered subset.

7. The apparatus of claim 6, wherein the parity checking relationship is a set of parity checking relationships.

8. The apparatus of claim 7, wherein the set of parity checking relationships are parity equations.

9. The apparatus of claim 6, wherein the means for decoding includes a convolutional decoding process.

10. The apparatus of claim 6, wherein the byte-code encoding process is based on a short linear block code in the Galois Field 256 space.

11. An apparatus for decoding a bitstream, comprising:
    an input controller that receives a demodulated bitstream, the demodulated bitstream encoded using a byte-code encoding process;
    an input re-ordering device that arranges the demodulated bitstream into a plurality of subsets, each subset containing a plurality of bits, the input re-ordering device identifies a set of symbols in each of the subsets, each symbol including at least two bits in the subset, the set of symbols related to a modulation format for the demodulated bitstream, the input re-ordering device further reorders the set of symbols in each subset of the plurality of subsets; and
    at least one trellis decoder that decodes each reordered subset based on a trellis relationship between the set of symbols in the reordered subset and a parity checking relationship between the bits in the reordered subset.

12. The apparatus of claim 11, wherein the parity checking relationship is a set of parity checking relationships.

13. The apparatus of claim 12, wherein the set of parity checking relationships are parity equations.

14. The apparatus of claim 11, wherein the at least one trellis decoder includes a convolutional decoding process.

15. The apparatus of claim 11, wherein the byte-code encoding process is based on a short linear block code in the Galois Field 256 space.

* * * * *